United States Patent
Noda et al.

(10) Patent No.: US 9,929,280 B2
(45) Date of Patent: Mar. 27, 2018

(54) SEMICONDUCTOR DEVICE INCLUDING OXIDE SEMICONDUCTOR FILM CONTAINING INDIUM

(71) Applicant: Semiconductor Energy Laboratory Co., Ltd., Atsugi-shi, Kanagawa-ken (JP)

(72) Inventors: Kosei Noda, Atsugi (JP); Noriyoshi Suzuki, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/240,332

(22) Filed: Aug. 18, 2016

(65) Prior Publication Data
US 2016/0359048 A1    Dec. 8, 2016

Related U.S. Application Data

(62) Division of application No. 13/423,468, filed on Mar. 19, 2012, now Pat. No. 9,425,322.

(30) Foreign Application Priority Data

Mar. 28, 2011    (JP) ................................. 2011-069542

(51) Int. Cl.
*H01L 29/10*    (2006.01)
*H01L 29/12*    (2006.01)
(Continued)

(52) U.S. Cl.
CPC .... *H01L 29/7869* (2013.01); *H01L 21/02472* (2013.01); *H01L 21/02483* (2013.01);
(Continued)

(58) Field of Classification Search
CPC ......... H01L 21/02483; H01L 21/02472; H01L 21/02554; H01L 29/7869; H01L 21/02565
See application file for complete search history.

(56) References Cited

U.S. PATENT DOCUMENTS 5,429,983 A    7/1995    Takizawa et al.
5,528,032 A    6/1996    Uchiyama
(Continued)

FOREIGN PATENT DOCUMENTS

EP    1737044 A    12/2006
EP    1976018 A    10/2008
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
(Continued)

*Primary Examiner* — Thanh Y Tran
(74) *Attorney, Agent, or Firm* — Robinson Intellectual Property Law Office; Eric J. Robinson

(57) ABSTRACT

A highly reliable semiconductor device having stable electric characteristics is provided by suppressing, in a transistor including an oxide semiconductor film, diffusion of indium into an insulating film in contact with the oxide semiconductor film and improving the characteristics of the interface between the oxide semiconductor film and the insulating film. In an oxide semiconductor film containing indium, the indium concentration at a surface is decreased, thereby preventing diffusion of indium into an insulating film on and in contact with the oxide semiconductor film. By decreasing the indium concentration at the surface of the oxide semiconductor film, a layer which does not substantially contain indium can be formed at the surface. By using this layer as part of the insulating film, the characteristics of the interface between the oxide semiconductor film and the insulating film in contact with the oxide semiconductor film are improved.

27 Claims, 14 Drawing Sheets

(51) Int. Cl.
  *H01L 29/786* (2006.01)
  *H01L 21/02* (2006.01)
  *H01L 29/423* (2006.01)
  *H01L 29/66* (2006.01)

(52) U.S. Cl.
  CPC .. *H01L 21/02554* (2013.01); *H01L 21/02565* (2013.01); *H01L 21/02631* (2013.01); *H01L 21/02664* (2013.01); *H01L 29/42384* (2013.01); *H01L 29/66969* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,814,540 A | 9/1998 | Takemura et al. |
| 5,900,646 A | 5/1999 | Takizawa et al. |
| 5,946,560 A | 8/1999 | Uochi et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 7,943,414 B2 | 5/2011 | Shimomura et al. |
| 8,178,926 B2 | 5/2012 | Nakayama |
| 8,304,300 B2 | 11/2012 | Sakata et al. |
| 8,319,217 B2 * | 11/2012 | Kim .................... H01L 29/7869 257/43 |
| 8,502,221 B2 | 8/2013 | Yamazaki |
| 8,659,013 B2 | 2/2014 | Yamazaki |
| 8,735,884 B2 | 5/2014 | Sakata et al. |
| 8,779,478 B2 | 7/2014 | Moriguchi et al. |
| 8,884,282 B2 | 11/2014 | Yamazaki |
| 8,912,537 B2 | 12/2014 | Wakana et al. |
| 9,059,295 B2 | 6/2015 | Yamazaki |
| 9,130,046 B2 | 9/2015 | Sakata et al. |
| 9,136,389 B2 | 9/2015 | Yamazaki et al. |
| 9,147,768 B2 | 9/2015 | Yamazaki |
| 9,190,522 B2 | 11/2015 | Yamazaki |
| 9,196,739 B2 | 11/2015 | Yamazaki |
| 2001/0015221 A1 | 8/2001 | Kubota et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0212002 A1 | 9/2005 | Sanga et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197350 A1 * | 8/2008 | Park .................... H01L 29/7869 257/43 |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0250693 A1 | 10/2009 | Jeong et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0038716 A1 | 2/2010 | Yamazaki et al. |
| 2010/0065844 A1 | 3/2010 | Tokunaga |
| 2010/0073268 A1 | 3/2010 | Matsunaga et al. |
| 2010/0092800 A1 | 4/2010 | Itagaki et al. |
| 2010/0102312 A1 | 4/2010 | Yamazaki et al. |
| 2010/0109002 A1 | 5/2010 | Itagaki et al. |
| 2010/0136743 A1 | 6/2010 | Akimoto et al. |
| 2010/0148170 A1 | 6/2010 | Ueda et al. |
| 2011/0012106 A1 | 1/2011 | Yamazaki et al. |
| 2011/0062436 A1 | 3/2011 | Yamazaki et al. |
| 2011/0068335 A1 | 3/2011 | Yamazaki et al. |
| 2011/0104851 A1 | 5/2011 | Akimoto et al. |
| 2011/0114939 A1 * | 5/2011 | Kim .................. H01L 29/78696 257/43 |
| 2011/0117697 A1 | 5/2011 | Akimoto et al. |
| 2011/0121290 A1 | 5/2011 | Akimoto et al. |

(56) References Cited

U.S. PATENT DOCUMENTS

| | | | |
|---|---|---|---|
| 2011/0140100 A1* | 6/2011 | Takata | H01L 29/7869 257/43 |
| 2011/0163311 A1 | 7/2011 | Akimoto et al. | |
| 2012/0040495 A1 | 2/2012 | Noda et al. | |
| 2012/0132902 A1 | 5/2012 | Imoto et al. | |
| 2012/0187396 A1 | 7/2012 | Yamazaki et al. | |
| 2012/0241735 A1 | 9/2012 | Honda et al. | |
| 2015/0325600 A1 | 11/2015 | Sakata et al. | |

FOREIGN PATENT DOCUMENTS

| | | | |
|---|---|---|---|
| EP | 2197034 A | 6/2010 | |
| EP | 2226847 A | 9/2010 | |
| EP | 2423966 A | 2/2012 | |
| EP | 2579316 A | 4/2013 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 06-275697 A | 9/1994 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2007-096055 A | 4/2007 | |
| JP | 2007-123861 A | 5/2007 | |
| JP | 2008-276211 A | 11/2008 | |
| JP | 2009-212476 A | 9/2009 | |
| JP | 2010-074061 A | 4/2010 | |
| JP | 2010-161339 A | 7/2010 | |
| JP | 2011-061102 A | 3/2011 | |
| TW | 201030983 | 8/2010 | |
| TW | 201110243 | 3/2011 | |
| WO | WO-2004/114391 | 12/2004 | |
| WO | WO-2008/126883 | 10/2008 | |
| WO | WO-2011/132769 | 10/2011 | |
| WO | WO-2011/151990 | 12/2011 | |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

(56) References Cited

OTHER PUBLICATIONS

Ohara.H et al., "Amorphous In—Ga—Zn-Oxide TFTs with Suppressed Variation for 4.0 inch QVGA Amoled Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties"; SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YBFE204, and YB2FE307 Types of Structures for Compounds in the In2O3 and SC2O3—A2O3—BO Systems [A; Fe, Ga, Or, Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

(56) References Cited

OTHER PUBLICATIONS

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Taiwanese Office Action (Application No. 101109506) dated Mar. 16, 2016.

\* cited by examiner

SEMICONDUCTOR DEVICE INCLUDING OXIDE SEMICONDUCTOR FILM CONTAINING INDIUM

BACKGROUND OF THE INVENTION

1. Field of the Invention

The present invention relates to a semiconductor device provided with a circuit including a semiconductor element such as a transistor, and a method for manufacturing the semiconductor device. For example, the present invention relates to a power device which is mounted on a power supply circuit; a semiconductor integrated circuit including a memory, a thyristor, a converter, an image sensor, or the like; an electro-optical device typified by a liquid crystal display device; a light-emitting display device including a light-emitting element; and an electronic device on which any of the above is mounted as a component.

In this specification, a "semiconductor device" generally refers to a device which can function by utilizing semiconductor characteristics; an electro-optical device, a light-emitting display device, a semiconductor circuit, and an electronic device are all included in the category of the semiconductor device.

2. Description of the Related Art

Transistors formed over a glass substrate or the like are typically formed using amorphous silicon, polycrystalline silicon, or the like, as typically seen in liquid crystal display devices. Although transistors formed using amorphous silicon have low field-effect mobility, they can be formed over a larger glass substrate. On the other hand, although transistors formed using polycrystalline silicon have high field-effect mobility, they are not suitable for being formed over a larger glass substrate.

In view of the foregoing, attention has been drawn to a technique in which a transistor is formed using an oxide semiconductor and such a transistor is applied to an electronic device or an optical device. For example, Patent Document 1 and Patent Document 2 disclose a technique in which a transistor is formed using an In—Ga—Zn-based oxide as an oxide semiconductor and such a transistor is used as a switching element or the like of a pixel in a display device.

REFERENCE

Patent Document

[Patent Document 1] Japanese Published Patent Application No. 2007-123861
[Patent Document 2] Japanese Published Patent Application No. 2007-096055

SUMMARY OF THE INVENTION

In a transistor formed using silicon, a silicon oxide film is used for a gate insulating film in many cases, which means that the main component of an active layer corresponds to the main component of the gate insulating film. Therefore, distortion or the like is unlikely to occur at the interface between the active layer and the gate insulating film compared to the interface between films whose main components are different from each other, and the active layer and the gate insulating film are compatible with each other. Also in a transistor formed using an oxide semiconductor, a silicon oxide film is used for a gate insulating film in many cases as in a transistor formed using silicon. In this case, the main components of an active layer and the gate insulating film are different, and the two films are not compatible with each other. Accordingly, interface states are likely to increase, interface characteristics are unstable, and the reliability of the transistor is poor.

Further, among indium, gallium, and zinc in an In—Ga—Zn-based oxide, indium has the lowest bond energy to oxygen (O). Thus, in the manufacturing process of a transistor, there is a concern that a bond between indium (In) and oxygen (O) might be cut through heat treatment or the like and diffusion of indium into an insulating film in contact with an oxide semiconductor film might be caused. Therefore, for example, indium might be diffused as an impurity into a gate insulating film or the like, leading to an increase in leakage current.

It is an object of an embodiment of the present invention to suppress diffusion of indium into an insulating film which is formed in contact with an oxide semiconductor film.

It is an object of an embodiment of the present invention to provide a semiconductor device having stable electric characteristics and high reliability by improving, in a transistor including an oxide semiconductor, the characteristics of the interface between an oxide semiconductor film and an insulating film in contact with the oxide semiconductor film.

An embodiment of the present invention has the following technical idea. In an oxide semiconductor film containing indium, the concentration of indium at a surface of the oxide semiconductor film is decreased, whereby diffusion of indium into an insulating film which is formed on and in contact with the oxide semiconductor film is prevented.

In addition, an embodiment of the present invention has the following technical idea. By decreasing the concentration of indium at the surface of the oxide semiconductor film, a layer which does not substantially contain indium can be formed at the surface of the oxide semiconductor film. By using this layer as part of the insulating film, the characteristics of the interface between the oxide semiconductor film and the insulating film in contact with the oxide semiconductor film is improved.

An embodiment of the present invention is a semiconductor device including: an oxide semiconductor film containing indium, a first insulating film in contact with a bottom surface of the oxide semiconductor film, a second insulating film in contact with a top surface of the oxide semiconductor film, a gate electrode overlapping with the oxide semiconductor film with the first insulating film or the second insulating film interposed therebetween, and source and drain electrodes connected to the oxide semiconductor film. The concentration of indium in a first region of the oxide semiconductor film, which is not in contact with the second insulating film, is higher than that in a second region of the oxide semiconductor film, which is in contact with the second insulating film and is not in contact with the first insulating film. Further, the concentration of indium in the region of the oxide semiconductor film, which is not in contact with the second insulating film, is higher than or equal to 10 at. % and lower than or equal to 25 at. %. In other words, the concentration of indium in the second region of the oxide semiconductor film, which is in contact with the second insulating film and between the second insulating film and the first region, is lower than that in the first region of the oxide semiconductor film, which is in contact with the first insulating film. The concentration of indium in the first region of the oxide semiconductor film is higher than or equal to 10 at. % and lower than or equal to 25 at. %. It is preferable that the concentration of indium in the second region of the oxide semiconductor film be higher than or equal to 0 at. % and lower than or equal to 13 at. %.

The above semiconductor device may have either a top gate structure or a bottom gate structure. In addition, either a bottom contact structure in which a source electrode and a drain electrode are formed below an oxide semiconductor film or a top contact structure in which a source electrode and a drain electrode are formed over an oxide semiconductor film may be employed.

In addition, also in a structure in which a gate electrode overlaps with source and drain electrodes, an offset region in which the gate electrode does not overlap with the source and drain electrodes may be formed in an oxide semiconductor film. Further, the offset region in the oxide semiconductor film may be doped with dopant in order to decrease its electric resistance. As the dopant, phosphorus (P), boron (B), arsenic (As), or nitrogen (N) can be used.

In an embodiment of the present invention, the above oxide semiconductor film contains at least one element selected from Ga, Sn, and Zn.

An embodiment of the present invention is a semiconductor device including: an oxide semiconductor film containing indium, source and drain electrodes in contact with the oxide semiconductor film, an oxide insulating film which does not overlap with the source and drain electrodes and is in contact with the oxide semiconductor film, a gate insulating film covering the oxide insulating film and the source and drain electrodes, and a gate electrode overlapping with the oxide semiconductor film with the gate insulating film interposed therebetween. The oxide insulating film essentially contains elements except indium of elements included in the oxide semiconductor film. The oxide semiconductor film contains at least one element selected from Ga, Sn, and Zn. Further, the concentration of indium in the oxide semiconductor film is higher than or equal to 10 at. % and lower than or equal to 25 at. %. That is, the oxide insulating film is an insulating film essentially containing at least one element selected from Ga, Sn, and Zn.

An embodiment of the present invention is a semiconductor device including: a gate electrode, a gate insulating film covering the gate electrode, an oxide semiconductor film containing indium overlapping with the gate electrode with the gate insulating film interposed therebetween, source and drain electrodes in contact with the oxide semiconductor film, and an oxide insulating film which does not overlap with the source and drain electrodes and is in contact with the oxide semiconductor film. The oxide insulating film essentially contains elements except indium of elements included in the oxide semiconductor film. The oxide semiconductor film contains at least one element selected from Ga, Sn, and Zn. Further, the concentration of indium in the oxide semiconductor film is higher than or equal to 10 at. % and lower than or equal to 25 at. %. That is, the oxide insulating film is an insulating film essentially containing at least one element selected from Ga, Sn, and Zn.

In an embodiment of the present invention, by exposing an oxide semiconductor film containing indium to a reducing atmosphere, indium is released from a surface of the oxide semiconductor film, which is exposed to the reducing atmosphere, whereby a concentration gradient of indium is caused in the film thickness direction. In addition, by further releasing indium, indium in a region of the oxide semiconductor film, which is exposed to the reducing atmosphere is all removed therefrom, whereby a film having a composition different from that of a region of the oxide semiconductor film, which is not exposed to the reducing atmosphere, is formed.

The above-described reducing atmosphere can be a silane atmosphere, a hydrogen atmosphere, or the like and can be formed with the use of a plasma CVD apparatus.

In accordance with an embodiment of the present invention, it is possible to suppress diffusion of indium into an insulating film which is formed in contact with an oxide semiconductor film.

In accordance with an embodiment of the present invention, it is possible to provide a semiconductor device having stable electric characteristics and high reliability by improving, in a transistor including an oxide semiconductor, the characteristics of the interface between an oxide semiconductor film and an insulating film in contact with the oxide semiconductor film.

DETAILED DESCRIPTION OF THE INVENTION

Figure 1A:
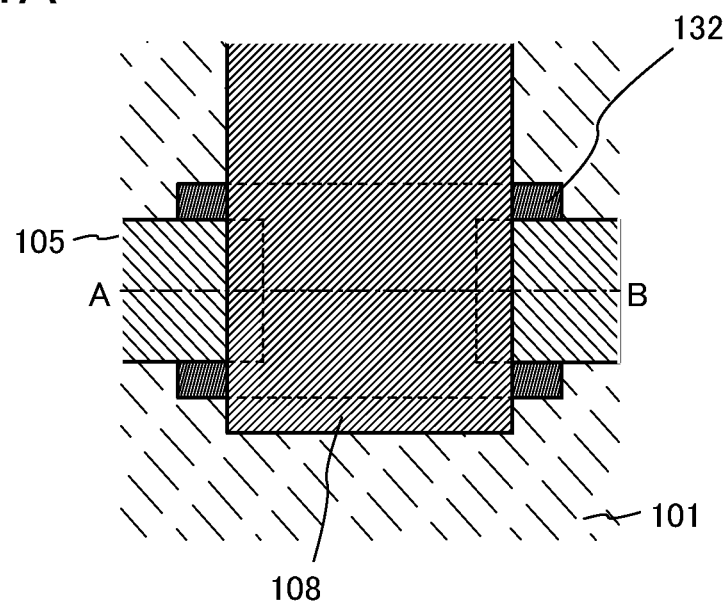
FIGS. 1A and 1B are a top view and a cross-sectional view illustrating an example of a semiconductor device according to an embodiment of the present invention.

Embodiments of the present invention will be described in detail with reference to the accompanying drawings. However, the present invention is not limited to the description below, and those skilled in the art will appreciate that a variety of modifications can be made to modes and details without departing from the spirit and the scope of the present invention. Therefore, the present invention should not be construed as being limited to the description in the following embodiments. Note that the same portions or portions having similar functions in the structure of the present invention described below are denoted by the same reference numerals throughout the drawings and repetitive description thereof will be omitted.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

In addition, in this specification, when one of a source and a drain of a transistor is called a drain, the other is called a source. That is, they are not distinguished depending on the potential level. Therefore, a region called a source in this specification can alternatively be referred to as a drain.

Embodiment 1

In this embodiment, an example of a transistor which is a semiconductor device according to an embodiment of the present invention will be described with reference to FIGS. 1A and 1B and FIGS. 2A to 2C.

Figure 1B:
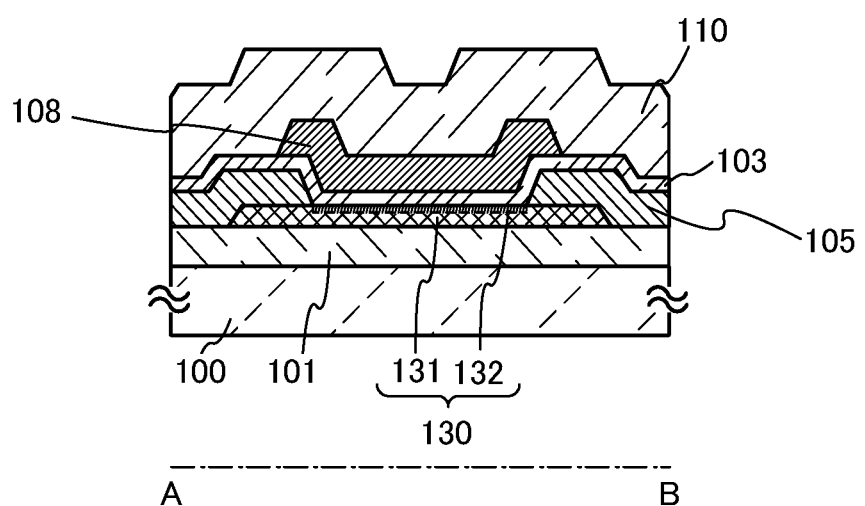

FIG. 1A is a top view of the transistor. FIG. 1B is a cross-sectional view taken along dashed and dotted line A-B of FIG. 1A. In FIG. 1A, some of components of the transistor are omitted to avoid complexity.

Here, cross section A-B in FIG. 1B will be described in detail.

The transistor illustrated in FIG. 1B includes a base insulating film 101 over a substrate 100, an oxide semiconductor film 130 containing indium over the base insulating film 101, source and drain electrodes 105 in contact with the oxide semiconductor film 130, a gate insulating film 103 covering the oxide semiconductor film 130 and the source and drain electrodes 105, a gate electrode 108 overlapping with the oxide semiconductor film 130 with the gate insulating film 103 interposed therebetween, and an interlayer insulating film 110 covering the gate insulating film 103 and the gate electrode 108. The oxide semiconductor film 130 includes a region 131 which is not in contact with the gate insulating film 103 and a region 132 which is in contact with the gate insulating film 103 and is not in contact with the base insulating film 101. In other words, the oxide semiconductor film 130 includes the region 131 in contact with the base insulating film 101 and the region 132 in contact with the gate insulating film 103 and between the gate insulating film 103 and the region 131. Further, contact holes may be formed in the interlayer insulating film 110, and wirings connected to the source and drain electrodes 105 through the contact holes may be provided.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like can be used as the substrate 100. Still alternatively, any of these substrates further provided with a semiconductor element may be used as the substrate 100.

A flexible substrate may also be used as the substrate 100. In that case, a transistor may be directly formed over the flexible substrate. Note that as a method for forming a transistor over a flexible substrate, there is also a method in which, after a transistor is formed over a non-flexible substrate, the transistor is separated from the non-flexible substrate and transferred to a flexible substrate corresponding to the substrate 100. In that case, a separation layer is preferably provided between the non-flexible substrate and the transistor.

The base insulating film 101 may be a single layer or a stack formed using one or more of a silicon oxide film, a silicon oxynitride film, a silicon nitride oxide film, a silicon nitride film, a gallium oxide film, an aluminum oxide film, an aluminum oxynitride film, and a Ga—Zn-based metal oxide film.

Note that here, silicon oxynitride contains more oxygen than nitrogen and contains, for example, oxygen, nitrogen, silicon, and hydrogen at concentrations of higher than or equal to 50 at. % and lower than or equal to 70 at. %, higher than or equal to 0.5 at. % and lower than or equal to 15 at. %, higher than or equal to 25 at. % and lower than or equal to 35 at. %, and higher than or equal to 0 at. % and lower than or equal to 10 at. %, respectively. Further, silicon nitride oxide contains more nitrogen than oxygen and contains, for example, oxygen, nitrogen, silicon, and hydrogen at concentrations of higher than or equal to 5 at. % and lower than or equal to 30 at. %, higher than or equal to 20 at. % and lower than or equal to 55 at. %, higher than or equal to 25 at. % and lower than or equal to 35 at. %, and higher than or equal to 10 at. % and lower than or equal to 25 at. %, respectively. Note that the percentages of oxygen, nitrogen, silicon, and hydrogen fall within the aforementioned ranges in the case where measurement is performed using Rutherford backscattering spectrometry (RBS) or hydrogen forward scattering (HFS). Moreover, the total percentage of the constituent elements does not exceed 100 at. %.

Further, the base insulating film 101 may be formed using a film from which oxygen is released by heating.

"Oxygen is released by heating" means that the amount of released oxygen which is converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS).

Here, a method in which the amount of released oxygen is measured by conversion into oxygen atoms using TDS analysis will be described.

The amount of a released gas in TDS analysis is proportional to the integral value of a spectrum. Therefore, the amount of a released gas can be calculated from the ratio between the integral value of a spectrum of a measurement sample and the reference value of a standard sample. The reference value of a standard sample refers to the ratio of the density of a predetermined atom contained in the sample to the integral value of a spectrum.

For example, the amount of oxygen molecules ($N_{O2}$) released from a measurement sample can be found according to Equation 1 with the TDS analysis results of a silicon wafer containing hydrogen at a predetermined density which is the standard sample and the TDS analysis results of the measurement sample. Here, all spectra having a mass number of 32 which are obtained by the TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N_{O2}=N_{H2}/S_{H2} \times S_{O2} \times \alpha \quad \text{(Equation 1)}$$

$N_{H2}$ is the value obtained by conversion of the amount of hydrogen molecules desorbed from the standard sample into densities. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the measurement sample is subjected to TDS analysis. $\alpha$ is a coefficient affecting the intensity of the spectrum in the TDS analysis. Refer to Japanese Published Patent Application No. H6-275697 for details of Equation 1. Note that the amount of released oxygen from the above measurement sample is measured with a thermal desorption spectroscopy apparatus produced by ESCO Ltd., EMD-WA1000S/W using a silicon wafer containing a hydrogen atom at $1\times10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen converted into an oxygen atom is twice the amount of the released oxygen molecules.

In the above structure, the film from which oxygen is released by heating may be an oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

By using the base insulating film from which oxygen is released by heating as described above, oxygen is supplied from the base insulating film to the oxide semiconductor film, so that interface states of the interface between the base insulating film and the oxide semiconductor film can be decreased. As a result, electric charge or the like which may be produced owing to an operation of the transistor or the like can be prevented from being trapped at the interface between the base insulating film and the oxide semiconductor film, whereby a transistor with less deterioration in electric characteristics can be provided.

Further, in some cases, electric charge is generated owing to oxygen deficiency in the oxide semiconductor film. In general, when oxygen deficiency is generated in the oxide semiconductor film, part of the oxygen deficiency serves a donor and generates an electron which is a carrier. As a result, the threshold voltage of a transistor shifts in the negative direction. This tendency occurs remarkably in oxygen deficiency caused on the back channel side. Note that a back channel in this embodiment refers to the vicinity of an interface of the oxide semiconductor film with the base insulating film. When oxygen is sufficiently released from the base insulating film to the oxide semiconductor film as described above, oxygen deficiency in the oxide semiconductor film which causes the negative shift of the threshold voltage can be decreased.

That is, by providing the film from which oxygen is released by heating as the base insulating film, interface states of the interface between the oxide semiconductor film and the base insulating film and the oxygen deficiency in the oxide semiconductor film can be decreased, and the influence of the trapping of electric charge at the interface between the oxide semiconductor film and the base insulating film can be made small.

The oxide semiconductor film 130 may be formed by a sputtering method, a plasma CVD method, a pulsed laser deposition (PLD) method, a molecular beam epitaxy (MBE) method, a coating method, a printing method, an evaporation method, or the like.

A sputtering apparatus used for forming the oxide semiconductor film by a sputtering method will be described in detail below.

The leakage rate of a treatment chamber in which the oxide semiconductor film is formed is preferably lower than or equal to $1\times10^{-10}$ Pa·m$^3$/sec., whereby entry of an impurity into the film to be formed by a sputtering method can be decreased.

In order to decrease the leakage rate, internal leakage as well as external leakage needs to be decreased. The external leakage refers to inflow of a gas from the outside of a vacuum system through a minute hole, a sealing defect, or the like. The internal leakage is due to leakage through a partition, such as a valve, in a vacuum system or due to a released gas from an internal member. Measures need to be taken from both aspects of the external leakage and the internal leakage in order that the leakage rate be lower than or equal to $1\times10^{-10}$ Pa·m$^3$/sec.

In order to decrease the external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and can decrease the external leakage. Further, with the use of a metal material covered with iron fluoride, aluminum oxide, chromium oxide, or the like which is in the passive state, a released gas containing hydrogen generated from the metal gasket is suppressed, so that the internal leakage can also be decreased.

As a member for forming an inner wall of the treatment chamber, aluminum, chromium, titanium, zirconium, nickel, or vanadium, from which the amount of a released gas containing hydrogen is small, is used. An alloy material containing iron, chromium, nickel, or the like covered with the above-mentioned material may also be used. The alloy material containing iron, chromium, nickel, or the like is rigid, resistant to heat, and suitable for processing. Here, when surface unevenness of the member is decreased by polishing or the like to decrease the surface area, the released gas can be decreased. Alternatively, the above-mentioned member of the film formation apparatus may be covered with iron fluoride, aluminum oxide, chromium oxide, or the like which is in the passive state.

Furthermore, it is preferable to provide a refiner for a sputtering gas just in front of the treatment chamber. At this time, the length of a pipe between the refiner and the treatment chamber is less than or equal to 5 m, preferably less than or equal to 1 m. When the length of the pipe is less than or equal to 5 m, preferably less than or equal to 1 m, the effect of the released gas from the pipe can be decreased accordingly.

Evacuation of the treatment chamber is preferably performed with rough vacuum pumps such as a dry pump and high vacuum pumps such as a sputter ion pump, a turbo molecular pump, and a cryopump in appropriate combination. The turbo molecular pump has an outstanding capability in removing a large-sized molecule, whereas it has a low capability in removing hydrogen or water. Hence, combination with a cryopump having a high capability in removing water or a sputter ion pump having a high capability in removing hydrogen is effective.

An adsorbate present at the inner wall of the treatment chamber does not affect the pressure in the treatment chamber because it is adsorbed on the inner wall, but the adsorbate leads to release of a gas at the time of the evacuation of the treatment chamber. Therefore, although the leakage rate and the evacuation rate do not have a correlation, it is preferable that the adsorbate present in the treatment chamber be removed as much as possible and evacuation be performed in advance with the use of a pump having high evacuation capability. Note that the treatment chamber may be subjected to baking for promotion of release of the adsorbate. By the baking, the rate of release of the adsorbate can be increased about tenfold. The baking should be performed at a temperature of higher than or equal to 100° C. and lower than or equal to 450° C. At this time, when the adsorbate is released while an inert gas is introduced, the rate of release of water or the like, which is difficult to release only by evacuation, can be further increased.

In a sputtering method, an RF power supply device, an AC power supply device, a DC power supply device, or the like can be used as a power supply device for generating plasma as appropriate.

The oxide semiconductor film 130 containing indium preferably contains one or more elements selected from Ga, Sn, and Zn. Such an oxide semiconductor can be formed using, for example, a target of a four-component metal oxide such as an In—Sn—Ga—Zn-based metal oxide; a three-component metal oxide such as an In—Ga—Zn-based metal oxide, an In—Sn—Zn-based metal oxide, or an In—Al—Zn-based metal oxide; a two-component metal oxide such as an In—Zn-based metal oxide; or the like. In addition, any of the above oxide semiconductors may contain an element other than In, Ga, Sn, and Zn, or a compound containing the element such as $SiO_2$ which is an oxide of Si.

For example, an In—Ga—Zn-based oxide semiconductor means an oxide semiconductor containing indium (In), gallium (Ga), and zinc (Zn).

As the oxide semiconductor, a thin film represented by the chemical formula, $InMO_3(ZnO)_m$ (m>0) can be used. Here, M represents one or more metal elements selected from Zn, Ga, Al, Mn, Co, Sn, Hf, Ti and Zr. For example, M can be Ga, Ga and Al, Ga and Mn, Ga and Co, or the like.

In the case where an In—Ga—Zn—O-based material is used as the oxide semiconductor, an example of the target is a metal oxide target containing In, Ga, and Zn at a composition ratio where $In_2O_3:Ga_2O_3:ZnO=1:1:1$ [molar ratio]. Alternatively, a target having a composition ratio where $In_2O_3:Ga_2O_3:ZnO=1:1:2$ [molar ratio], a target having a composition ratio where $In_2O_3:Ga_2O_3:ZnO=1:1:4$ [molar ratio], or a target having a composition ratio where $In_2O_3:Ga_2O_3:ZnO=2:1:8$ [molar ratio] can be used. Further alternatively, a target having a composition ratio where $In_2O_3:ZnO=25:1$ to 1:4 [molar ratio] can be used.

In the case where an In—Zn—O-based material is used as the oxide semiconductor, a target therefor has a composition ratio where In:Zn=50:1 to 1:2 in an atomic ratio ($In_2O_3:ZnO=25:1$ to 1:4 in a molar ratio), preferably In:Zn=20:1 to 1:1 in an atomic ratio ($In_2O_3:ZnO=10:1$ to 1:2 in a molar ratio), more preferably In:Zn=15:1 to 1.5:1 in an atomic ratio ($In_2O_3:ZnO=15:2$ to 3:4 in a molar ratio). For example, in a target used for formation of an In—Zn-based oxide semiconductor which has an atomic ratio where In:Zn:O=X:Y:Z, the relation of Z>1.5X+Y is satisfied.

As a sputtering gas, a rare gas (typically argon), oxygen, or a mixed gas of a rare gas and oxygen is used as appropriate. It is preferable that a high-purity gas from which impurities such as hydrogen, water, a hydroxyl group, or hydride are removed be used as a sputtering gas.

The oxide semiconductor film 130 is formed using a material whose band gap is greater than or equal to 2.5 eV, preferably greater than or equal to 3.0 eV in order to decrease the off-state current of the transistor.

The concentration of hydrogen contained in the oxide semiconductor film 130 is lower than $5\times10^{18}$ cm$^{-3}$, preferably lower than or equal to $1\times10^{18}$ cm$^{-3}$, more preferably lower than or equal to $5\times10^{17}$ cm$^{-3}$, still more preferably lower than or equal to $1\times10^{16}$ cm$^{-3}$.

An alkali metal is not an element constituting the oxide semiconductor, and therefore, is an impurity. An alkaline earth metal is also an impurity in the case where an alkaline earth metal is not an element constituting the oxide semiconductor. Specifically, when an insulating film in contact with the oxide semiconductor film is an oxide, sodium (Na) among the alkali metals diffuses into the insulating film as Na$^+$. In addition, in the oxide semiconductor film, Na cuts or enters a bond between a metal and oxygen which are included in the oxide semiconductor. As a result, for example, deterioration in characteristics of the transistor such as a normally-on state of the transistor due to a shift of the threshold voltage in the negative direction or a decrease in field-effect mobility occurs; in addition, variation in characteristics is also caused. Therefore, the concentration of an alkali metal which is an impurity in the oxide semiconductor is preferably decreased. Specifically, the measurement value of the Na concentration is preferably lower than or equal to $5\times10^{16}$ cm$^{-3}$, more preferably lower than or equal to $1\times10^{16}$ cm$^{-3}$, still more preferably lower than or equal to $1\times10^{15}$ cm$^{-3}$. In addition, the measurement value of the lithium (Li) concentration is preferably lower than or equal to $5\times10^{15}$ cm$^{-3}$, more preferably lower than or equal to $1\times10^{15}$ cm$^{-3}$. In addition, the measurement value of the potassium (K) concentration is preferably lower than or equal to $5\times10^{15}$ cm$^{-3}$, more preferably lower than or equal to $1\times10^{15}$ cm$^{-3}$.

By using the oxide semiconductor film 130 described above, the off-state current of the transistor can be made small. Specifically, the off-state current per micrometer of the channel width of the transistor can be lower than or equal to $1\times10^{-18}$ A, lower than or equal to $1\times10^{-21}$ A, or lower than or equal to $1\times10^{-24}$ A.

The substrate temperature in forming the oxide semiconductor film 130 is higher than or equal to 150° C. and lower than or equal to 450° C., preferably higher than or equal to 200° C. and lower than or equal to 350° C. The film formation is performed while the substrate is heated to higher than or equal to 150° C. and lower than or equal to 450° C., preferably higher than or equal to 200° C. and lower than or equal to 350° C., whereby moisture (including hydrogen) or the like can be prevented from entering the film.

The oxide semiconductor film is in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a decrease in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

With the use of the CAAC-OS film in the transistor, change in electric characteristics of the transistor due to irradiation with visible light or ultraviolet light can be decreased. Thus, the transistor has high reliability.

The concentration of indium contained in the region 132 of the oxide semiconductor film 130, which is in contact with the gate insulating film 103 and is not in contact with the base insulating film 101, is lower than that in the region 131 of the oxide semiconductor film 130, which is not in contact with the gate insulating film 103. The concentration of indium in the region 131 of the oxide semiconductor film 130, which is not in contact with the gate insulating film 103, is higher than or equal to 10 at. % and lower than or equal to 25 at. %. That is, the oxide semiconductor film 130 includes the region 131 in which the concentration of indium is higher than or equal to 10 at. % and lower than or equal to 25 at. % and the region 132 in which the concentration of indium is lower than that in the region 131. The concentration of indium in the region 132 is higher than or equal to 0 at. % and lower than or equal to 13 at. %, preferably higher than or equal to 0 at. % and lower than 10 at. %. As described above, the concentration of indium contained in the region 132 which is in contact with the gate insulating film 103 and is not in contact with the base insulating film 101 is lower than that in the region 131 which is not in contact with the gate insulating film 103, whereby diffusion of indium from the oxide semiconductor film 130 into the gate insulating film 103 which is formed on and in contact with the oxide semiconductor film 130 can be suppressed. Accordingly, an increase in gate leakage current can be suppressed.

The source and drain electrodes 105 are formed to have a single-layer structure or a stacked-layer structure using, as a conductive material, any of metals such as aluminum, titanium, chromium, nickel, copper, yttrium, zirconium, molybdenum, silver, tantalum, and tungsten or an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may also be used. The source and drain electrodes 105 also function as wirings.

The gate insulating film 103 may be, for example, formed with a single layer or a stack using one or more of silicon oxide, silicon oxynitride, silicon nitride oxide, silicon nitride, aluminum oxide, aluminum oxynitride, zirconium oxide, hafnium oxide, gallium oxide, a Ga—Zn-based metal oxide, and the like. For example, the gate insulating film 103 may be formed by a thermal oxidation method, a CVD method, a sputtering method, or the like. Moreover, plasma treatment may be performed in an atmosphere containing oxygen with a high-density plasma apparatus to improve the withstand voltage of the gate insulating film.

When the gate insulating film 103 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be decreased. Further, a stacked-layer structure can be used in which a high-k material and one or more of silicon oxide, silicon oxynitride, silicon nitride, silicon nitride oxide, aluminum oxide, aluminum oxynitride, and gallium oxide are stacked. The thickness of the gate insulating film 103 is preferably greater than or equal to 1 nm and less than or equal to 300 nm, more preferably greater than or equal to 5 nm and less than or equal to 50 nm.

The gate electrode 108 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese and zirconium may be used. In addition, the gate electrode 108 can have a single-layer structure or a stacked-layer structure including two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 108 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

As a material layer in contact with the gate insulating film 103, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) is preferably provided between the gate electrode 108 and the gate insulating film 103. These films each have a work function of higher than or equal to 5 eV, preferably higher than or equal to 5.5 eV; thus, the threshold voltage in the electric characteristics of the transistor can be positive. Accordingly, a so-called normally-off switching element can be obtained. For example, in the case of using an In—Ga—Zn—O film containing nitrogen, an In—Ga—Zn—O film having a nitrogen concentration of higher than that of at least the oxide semiconductor film 130, specifically, an In—Ga—Zn—O film having a nitrogen concentration of higher than or equal to 7 at. % is used.

The interlayer insulating film 110 may be formed with a single layer or a stack using one or more of silicon oxide, silicon oxynitride, silicon nitride oxide, silicon nitride, aluminum oxide, aluminum oxynitride, and aluminum nitride by a sputtering method, a CVD method, or the like. For example, the interlayer insulating film 110 may be formed by a plasma CVD method with the use of a mixture which includes a silane gas as a main material and a proper source gas selected from a nitrogen oxide gas, a nitrogen gas, a hydrogen gas, and a rare gas. In addition, the substrate temperature is preferably higher than or equal to 200° C. and lower than 550° C.

In addition, although the gate electrode overlaps with the source and drain electrodes in this embodiment, the present invention is not limited to this structure. For example, the gate electrode does not overlap with the source and drain electrodes, and an offset region is formed in the oxide semiconductor film. Further, the offset region in the oxide semiconductor film may be doped with dopant in order to decrease its electric resistance. As the dopant, phosphorus (P), boron (B), arsenic (As), or nitrogen (N) can be used.

With the structure as described above, diffusion of indium into the gate insulating film formed on and in contact with the oxide semiconductor film can be suppressed.

<Example of Method for Manufacturing Transistor>

Next, a method for manufacturing the transistor illustrated in FIGS. 1A and 1B will be described with reference to FIGS. 2A to 2C.

Figure 2A:
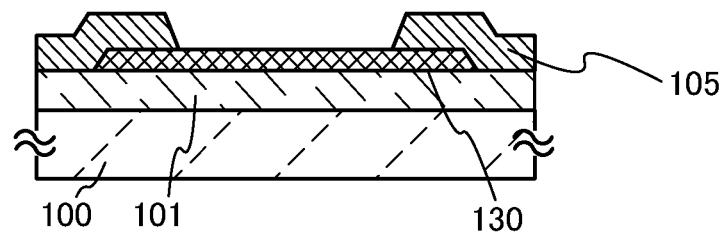
FIGS. 2A to 2C are cross-sectional views illustrating an example of a manufacturing process of a semiconductor device according to an embodiment of the present invention.

As illustrated in FIG. 2A, the base insulating film 101 is formed over the substrate 100.

Next, the oxide semiconductor film 130 containing indium is formed over the base insulating film 101.

The oxide semiconductor film 130 is formed in such a manner that an oxide semiconductor film with a thickness of greater than or equal to 1 nm and less than or equal to 50 nm is formed by a sputtering method, a mask is formed over the oxide semiconductor film, and the oxide semiconductor film is selectively etched with the use of the mask.

The mask used in the etching of the oxide semiconductor film can be formed as appropriate by a photolithography process, an inkjet method, a printing method, or the like. Wet etching or dry etching can be employed as appropriate for the etching of the oxide semiconductor film.

After the oxide semiconductor film is formed, the substrate 100 is preferably subjected to heat treatment to release moisture and hydrogen from the oxide semiconductor film. Through the heat treatment, a CAAC-OS film with higher crystallinity can be formed.

The temperature for the heat treatment is preferably set such that moisture and hydrogen can be released from the oxide semiconductor film; the temperature is typically higher than or equal to 200° C. and lower than the strain point of the substrate 100, preferably higher than or equal to 250° C. and lower than or equal to 450° C.

A rapid thermal annealing (RTA) apparatus can be used for the heat treatment. With the use of the RTA apparatus, heat treatment can be performed at a temperature of higher than or equal to the strain point of the substrate if it is a short time. Thus, the time required for formation of the CAAC-OS film can be shortened.

The heat treatment can be performed in an inert gas atmosphere; typically, the heat treatment is preferably performed in a rare gas (such as helium, neon, argon, xenon, or krypton) atmosphere or a nitrogen atmosphere. Alternatively, the heat treatment may be performed in an oxygen atmosphere, a reduced-pressure atmosphere, or in vacuum. The treatment time is 3 minutes to 24 hours. Heat treatment for longer than 24 hours is not preferable because the productivity is low.

Then, the source and drain electrodes 105 are formed over the oxide semiconductor film 130. The source and drain electrodes 105 are formed in such a manner that a conductive film is formed, a mask is formed over the conductive film, and the conductive film is selectively etched with the use of the mask.

Figure 2B:
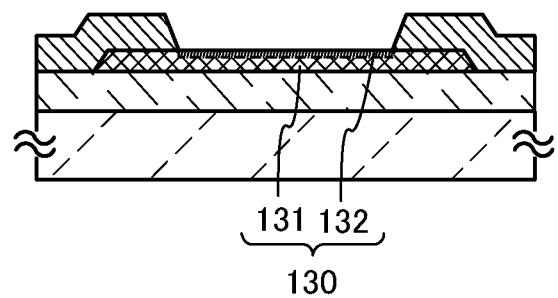

Next, as illustrated in FIG. 2B, a region of the oxide semiconductor film 130 which is not covered by the source and drain electrodes 105 is exposed to a reducing atmosphere. Accordingly, the region 131 which is not in contact with the gate insulating film 103 that is formed in a later step and the region 132 which is in contact with the gate insulating film 103 and is not in contact with the base insulating film 101 are formed.

The region of the oxide semiconductor film 130 which is not covered by the source and drain electrodes 105 can be exposed to the reducing atmosphere with the use of a plasma CVD apparatus, for example. As a gas for producing the reducing atmosphere, a silane ($SiH_4$) gas, a hydrogen ($H_2$) gas, or the like can be used. Alternatively, an atmosphere containing a mixture of a silane ($SiH_4$) gas, a hydrogen ($H_2$) gas, and the like may be used. Further, in order to promote decomposition of the gas, the substrate temperature is preferably increased in the treatment. For example, the substrate temperature is higher than or equal to 350° C. and lower than the strain point of the substrate.

By exposing the oxide semiconductor film 130 to the reducing atmosphere, indium contained in the oxide semiconductor film 130 can be reduced and released therefrom. As a result, the concentration of indium in the region of the oxide semiconductor film, which is exposed to the reducing atmosphere, is decreased.

By forming the region in which the concentration of indium is decreased in the oxide semiconductor film as described above, diffusion of indium from the oxide semiconductor film into the insulating film which is formed in contact with the oxide semiconductor film in a later step (the gate insulating film in this embodiment) can be suppressed.

Figure 2C:
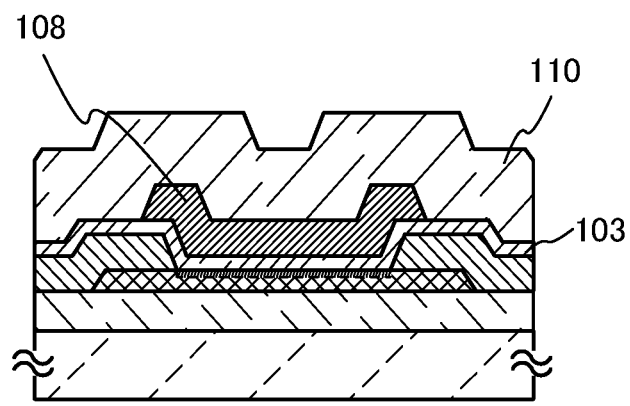

Then, as illustrated in FIG. 2C, the gate insulating film 103 is formed to cover the oxide semiconductor film 130 and the source and drain electrodes 105. Further, the gate electrode 108 is formed over the gate insulating film 103. The gate electrode 108 is formed in such a manner that a conductive film is formed, a mask is formed over the conductive film, and the conductive film is selectively etched with the use of the mask.

Then, the interlayer insulating film 110 is formed over the gate electrode 108 and the gate insulating film 103. Although not illustrated here, contact holes may be formed in the interlayer insulating film 110, and wirings connected to the source and drain electrodes 105 through the contact holes may be formed.

Through the above process, diffusion of indium into the gate insulating film which is formed on and in contact with the oxide semiconductor film can be suppressed.

Note that this embodiment can be combined with any of the other embodiments as appropriate.

Embodiment 2

In this embodiment, a transistor having a structure different from that of the transistor described in Embodiment 1 will be described with reference to FIG. 3.

A cross-sectional view of the transistor illustrated in FIG. 3 will be described in detail below.

Figure 3:
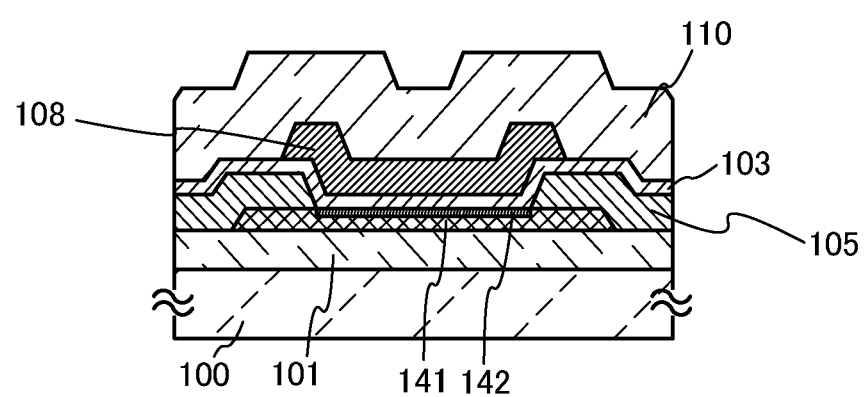
FIG. 3 is a cross-sectional view illustrating an example of a semiconductor device according to an embodiment of the present invention.

The transistor illustrated in FIG. 3 includes a base insulating film 101 over a substrate 100, an oxide semiconductor film 141 containing indium over the base insulating film 101, source and drain electrodes 105 in contact with the oxide semiconductor film 141, an oxide insulating film 142 which does not overlap with the source and drain electrodes 105 and is in contact with the oxide semiconductor film 141, a gate insulating film 103 covering the oxide insulating film 142 and the source and drain electrodes 105, a gate electrode 108 overlapping with the oxide semiconductor film 141 with the gate insulating film 103 interposed therebetween, and an interlayer insulating film 110 covering the gate insulating film 103 and the gate electrode 108. Further, contact holes may be formed in the interlayer insulating film 110, and wirings connected to the source and drain electrodes 105 through the contact holes may be provided.

The oxide semiconductor film 141 may be formed in a manner similar to that of the oxide semiconductor film 130 described in Embodiment 1.

The concentration of indium in the oxide semiconductor film 141 is higher than or equal to 10 at. % and lower than or equal to 25 at. %. By releasing indium from the oxide semiconductor film, the oxide semiconductor film 141 and the oxide insulating film 142 as a region which does not substantially contain indium are formed. The oxide insulating film 142 is in contact with a top surface of the oxide semiconductor film 141 and formed at least between the source and drain electrodes 105.

As described above, by forming the oxide insulating film 142, diffusion of indium from the oxide semiconductor film 141 into the gate insulating film 103 can be suppressed, and the characteristics of the interface between the oxide semiconductor film and the oxide insulating film can be improved.

In addition, the transistor in this embodiment can be formed by a manufacturing method similar to that in Embodiment 1.

With the use of the structure and the manufacturing method as described above, diffusion of indium into the gate insulating film which is formed on and in contact with the oxide semiconductor film can be suppressed, whereby an increase in gate leakage current can be suppressed. Further, the characteristics of the interface between the oxide semiconductor film and the oxide insulating film can be improved.

Note that this embodiment can be combined with any of the other embodiments as appropriate.

Embodiment 3

In this embodiment, a transistor having a structure different from those of the transistors described in Embodiments 1 and 2 will be described with reference to FIG. 4C. The transistor described in Embodiment 1 and 2 have a top contact structure, whereas the transistor described in this embodiment has a bottom contact structure.

Figure 4A:
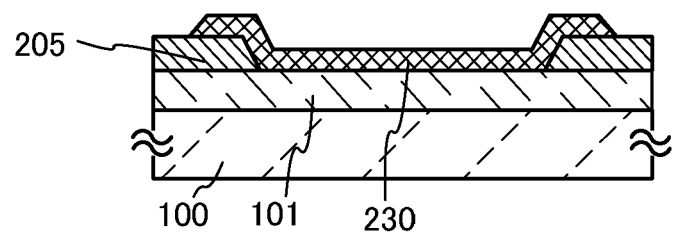
FIGS. 4A to 4C are cross-sectional views illustrating an example of a semiconductor device according to an embodiment of the present invention and an example of a manufacturing process thereof.
Figure 4B:
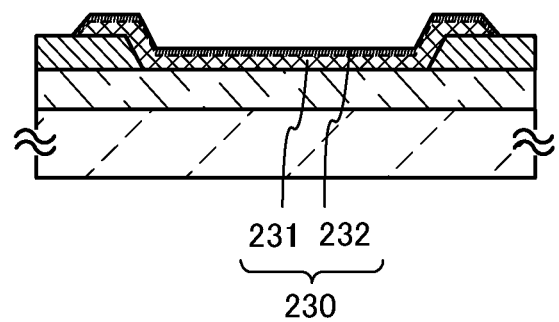
Figure 4C:
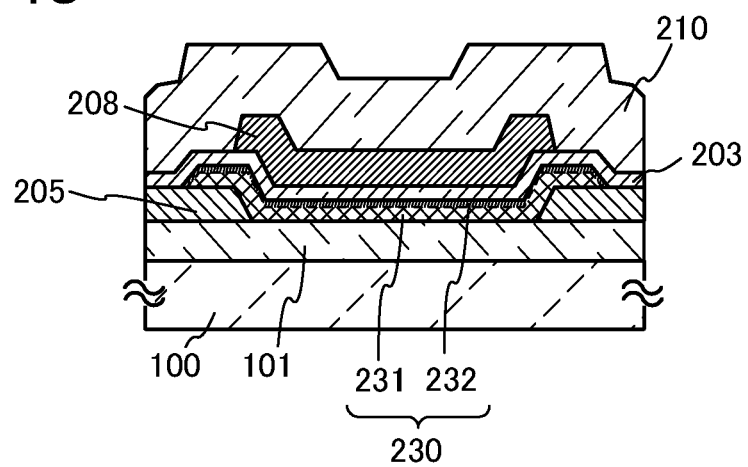

The transistor illustrated in FIG. 4C includes a base insulating film 101 over a substrate 100, source and drain electrodes 205 over the base insulating film 101, an oxide semiconductor film 230 containing indium partly in contact with the source and drain electrodes 205, a gate insulating film 203 covering the oxide semiconductor film 230 and the source and drain electrodes 205, a gate electrode 208 overlapping with the oxide semiconductor film 230 with the gate insulating film 203 interposed therebetween, and an interlayer insulating film 210 covering the gate insulating film 203 and the gate electrode 208. The oxide semiconductor film 230 includes a region 231 which is not in contact with the gate insulating film 203 and a region 232 which is in contact with the gate insulating film 203 and is not in contact with the base insulating film 101. In other words, the oxide semiconductor film 230 includes the region 231 in contact with the base insulating film 101 and the region 232 in contact with the gate insulating film 203 and between the gate insulating film 203 and the region 231. Further, contact holes may be formed in the interlayer insulating film 210, and wirings connected to the source and drain electrodes 205 through the contact holes may be provided.

The oxide semiconductor film, the source and drain electrodes, the gate insulating film, the gate electrode, and the interlayer insulating film described in this embodiment may be formed in a manner similar to that in Embodiment 1.

In addition, although the gate electrode overlaps with the source and drain electrodes in this embodiment, the present invention is not limited to this structure. For example, the gate electrode does not overlap with the source and drain electrodes and an offset region may be formed in the oxide semiconductor film. Further, the offset region in the oxide semiconductor film may be doped with dopant in order to decrease its electric resistance. As the dopant, phosphorus (P), boron (B), arsenic (As), or nitrogen (N) can be used.

The concentration of indium contained in the region 232 of the oxide semiconductor film 230, which is in contact with the gate insulating film 203 and is not in contact with the base insulating film 101, is lower than that in the region 231 of the oxide semiconductor film 230, which is not in contact with the gate insulating film 203. The concentration of indium in the region 231 of the oxide semiconductor film 230, which is not in contact with the gate insulating film 203, is higher than or equal to 10 at. % and lower than or equal to 25 at. %. That is, the oxide semiconductor film 230 includes the region 231 in which the concentration of indium is higher than or equal to 10 at. % and lower than or equal to 25 at. % and the region 232 in which the concentration of indium is lower than that in the region 231. The concentration of indium in the region 232 is higher than or equal to 0 at. % and lower than or equal to 13 at. %, preferably higher than or equal to 0 at. % and lower than 10 at. %. As described above, the concentration of indium contained in the region 232 which is in contact with the gate insulating film 203 and is not in contact with the base insulating film 101 is lower than that in the region 231 which is not in contact with the gate insulating film 203, whereby diffusion of indium from the oxide semiconductor film 230 into the gate insulating film 203 which is formed on and in contact with the oxide semiconductor film 230 can be suppressed.

With the structure as described above, diffusion of indium into the gate insulating film formed on and in contact with the oxide semiconductor film can be suppressed.

<Example of Method for Manufacturing Transistor>

Next, a method for manufacturing the transistor illustrated in FIG. 4C is described with reference to FIGS. 4A to 4C.

As illustrated in FIG. 4A, the base insulating film 101 is formed over the substrate 100.

Next, the source and drain electrodes 205 are formed over the base insulating film 101. The source and drain electrodes 205 are formed in such a manner that a conductive film is formed, a mask is formed over the conductive film, and the conductive film is selectively etched with the use of the mask.

Then, the oxide semiconductor film 230 containing indium is formed over the source and drain electrodes 205.

The oxide semiconductor film 230 is formed in such a manner that an oxide semiconductor film with a thickness of greater than or equal to 1 nm and less than or equal to 50 nm is formed by a sputtering method, a mask is formed over the oxide semiconductor film, and the oxide semiconductor film is selectively etched with the use of the mask.

The mask used in the etching of the oxide semiconductor film can be formed as appropriate by a photolithography process, an inkjet method, a printing method, or the like. Wet etching or dry etching can be employed as appropriate for the etching of the oxide semiconductor film.

After the oxide semiconductor film is formed, the substrate 100 is preferably subjected to heat treatment to release moisture and hydrogen from the oxide semiconductor film. Through the heat treatment, a CAAC-OS film with higher crystallinity can be formed.

The temperature for the heat treatment is preferably set such that moisture and hydrogen can be released from the oxide semiconductor film; the temperature is typically higher than or equal to 200° C. and lower than the strain point of the substrate 100, preferably higher than or equal to 250° C. and lower than or equal to 450° C.

A rapid thermal annealing (RTA) apparatus can be used for the heat treatment. With the use of the RTA apparatus, heat treatment at a temperature of higher than or equal to the strain point of the substrate can be performed if it is a short time. Thus, the time required for formation of the CAAC-OS film can be shortened.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere, a reduced-pressure atmosphere, or in vacuum. The treatment time is 3 minutes to 24 hours. Heat treatment for longer than 24 hours is not preferable because the productivity is low.

Next, as illustrated in FIG. 4B, the oxide semiconductor film 230 is exposed to a reducing atmosphere. Accordingly, the region 231 which is not in contact with the gate insulating film 203 that is formed in a later step and the region 232 which is in contact with the gate insulating film 203 and is not in contact with the base insulating film 101 are formed.

The oxide semiconductor film 230 can be exposed to the reducing atmosphere with the use of a plasma CVD apparatus, for example. As a gas for producing the reducing atmosphere, a silane ($SiH_4$) gas, a hydrogen ($H_2$) gas, or the like can be used. Alternatively, an atmosphere containing a mixture of a silane ($SiH_4$) gas, a hydrogen ($H_2$) gas, and the like may be used. Further, in order to promote decomposition of the gas, the substrate temperature is preferably increased in the treatment. For example, the substrate temperature is higher than or equal to 350° C. and lower than the strain point of the substrate.

By exposing the oxide semiconductor film 230 to the reducing atmosphere, indium contained in the oxide semiconductor film 230 can be reduced and released. As a result, the concentration of indium in the region of the oxide semiconductor film which is exposed to the reducing atmosphere is decreased.

By forming a region in which the concentration of indium is decreased in the oxide semiconductor film as described above, diffusion of indium from the oxide semiconductor film into the insulating film which is formed in contact with the oxide semiconductor film in a later step (the gate insulating film in this embodiment) can be suppressed.

Then, as illustrated in FIG. 4C, the gate insulating film 203 is formed to cover the oxide semiconductor film 230 and the source and drain electrodes 205. Further, the gate electrode 208 is formed over the gate insulating film 203. The gate electrode 208 is formed in such a manner that a conductive film is formed, a mask is formed over the conductive film, and the conductive film is selectively etched with the use of the mask.

Then, the interlayer insulating film 210 is formed over the gate electrode 208 and the gate insulating film 203. Although not illustrated here, contact holes may be provided in the interlayer insulating film 210 and wirings connected to the source and drain electrodes 205 through the contact holes may be formed.

Through the above process, diffusion of indium into the gate insulating film which is formed on and in contact with the oxide semiconductor film can be suppressed, whereby an increase in gate leakage current can be suppressed.

This embodiment can be combined with any of the other embodiments as appropriate.

Embodiment 4

In this embodiment, a transistor having a structure different from those of the transistors described in Embodiments 1 to 3 will be described with reference to FIG. 5C.

Figure 5A:
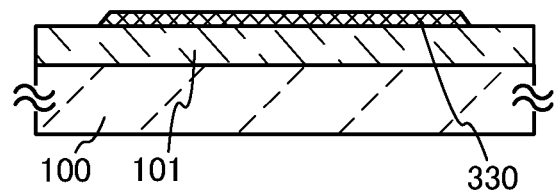
FIGS. 5A to 5C are cross-sectional views illustrating an example of a semiconductor device according to an embodiment of the present invention and an example of a manufacturing process thereof.
Figure 5B:
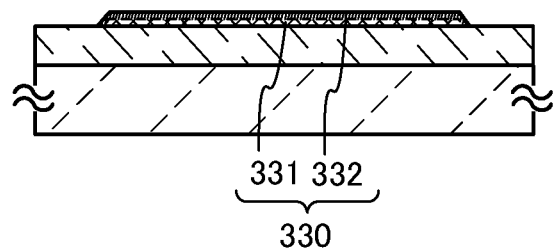
Figure 5C:
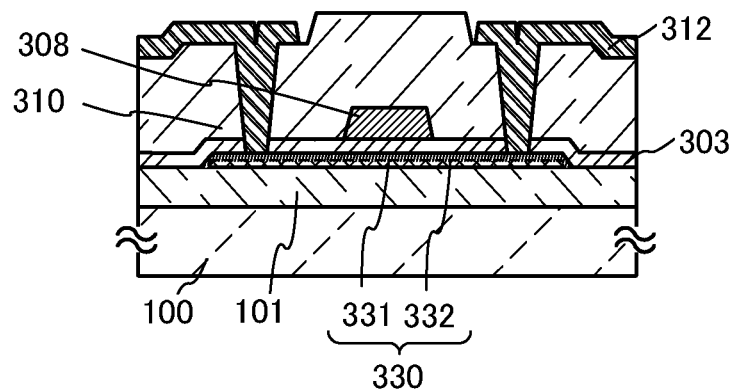

The transistor illustrated in FIG. 5C includes a base insulating film 101 over a substrate 100, an oxide semiconductor film 330 containing indium over the base insulating film 101, a gate insulating film 303 covering the oxide semiconductor film 330, a gate electrode 308 overlapping with the oxide semiconductor film 330 with the gate insulating film 303 interposed therebetween, and an interlayer insulating film 310 covering the gate insulating film 303 and the gate electrode 308. The oxide semiconductor film 330 includes a region 331 which is not in contact with the gate insulating film 303 and a region 332 which is in contact with the gate insulating film 303 and is not in contact with the base insulating film 101. In other words, the oxide semiconductor film 330 includes the region 331 in contact with the base insulating film 101 and the region 332 in contact with the gate insulating film 303 and between the gate insulating film 303 and the region 331. Further, contact holes are formed in the interlayer insulating film 310, and wirings 312 connected to the oxide semiconductor film 330 through the contact holes are formed.

The oxide semiconductor film, the gate insulating film, the gate electrode, and the interlayer insulating film described in this embodiment may be formed in a manner similar to that in Embodiment 1. In addition, the wirings may be formed in a manner similar to that of the source and drain electrodes in Embodiment 1.

In addition, although not illustrated in this embodiment, the oxide semiconductor film may be doped with dopant in a self-aligned manner using the gate electrode as a mask. As the dopant, phosphorus (P), boron (B), arsenic (As), or nitrogen (N) can be used. By doping the oxide semiconductor film with the dopant, the electric resistance of the doped region can be decreased, whereby the contact resistance with the wirings can be decreased.

The concentration of indium contained in the region 332 of the oxide semiconductor film 330, which is in contact with the gate insulating film 303 and is not in contact with the base insulating film 101, is lower than that in the region 331 of the oxide semiconductor film 330, which is not in contact with the gate insulating film 303. The concentration of indium in the region 331 of the oxide semiconductor film 330, which is not in contact with the gate insulating film 303, is higher than or equal to 10 at. % and lower than or equal to 25 at. %. That is, the oxide semiconductor film 330 includes the region 331 in which the concentration of indium is higher than or equal to 10 at. % and lower than or equal to 25 at. % and the region 332 in which the concentration of indium is lower than that in the region 331. The concentration of indium in the region 332 is higher than or equal to 0 at. % and lower than or equal to 13 at. %, preferably higher than or equal to 0 at. % and lower than 10 at. %. As described above, the concentration of indium contained in the region 332 which is in contact with the gate insulating film 303 and is not in contact with the base insulating film 101 is lower than that in the region 331 which is not in contact with the gate insulating film 303, whereby diffusion of indium from the oxide semiconductor film 330 into the gate insulating film 303 which is formed on and in contact with the oxide semiconductor film 330 can be suppressed.

With the structure as described above, diffusion of indium into the gate insulating film formed on and in contact with the oxide semiconductor film can be suppressed, whereby an increase in gate leakage current can be suppressed.

<Example of Method for Manufacturing Transistor>

Next, a method for manufacturing the transistor illustrated in FIG. 5C will be described with reference to FIGS. 5A to 5C.

As illustrated in FIG. 5A, the base insulating film 101 is formed over the substrate 100.

Next, the oxide semiconductor film 330 containing indium is formed over the base insulating film 101.

The oxide semiconductor film 330 is formed in such a manner that an oxide semiconductor film with a thickness of greater than or equal to 1 nm and less than or equal to 50 nm is formed by a sputtering method, a mask is formed over the oxide semiconductor film, and the oxide semiconductor film is selectively etched with the use of the mask.

The mask used in the etching of the oxide semiconductor film can be formed as appropriate by a photolithography process, an inkjet method, a printing method, or the like. Wet etching or dry etching can be employed as appropriate for the etching of the oxide semiconductor film.

After the oxide semiconductor film is formed, the substrate 100 is preferably subjected to heat treatment to release moisture and hydrogen from the oxide semiconductor film. Through the heat treatment, a CAAC-OS film with higher crystallinity can be formed.

The temperature for the heat treatment is preferably set such that moisture and hydrogen can be released from the oxide semiconductor film; the temperature is typically higher than or equal to 200° C. and lower than the strain point of the substrate 100, preferably higher than or equal to 250° C. and lower than or equal to 450° C.

A rapid thermal annealing (RTA) apparatus can be used for the heat treatment. With the use of the RTA apparatus, heat treatment at a temperature of higher than or equal to the strain point of the substrate can be performed if it is a short time. Thus, the time required for formation of the CAAC-OS film can be shortened.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere, a reduced-pressure atmosphere, or in vacuum. The treatment time is 3 minutes to 24 hours. Heat treatment for longer than 24 hours is not preferable because the productivity is low.

Next, as illustrated in FIG. 5B, the oxide semiconductor film 330 is exposed to a reducing atmosphere. Accordingly, the region 331 which is not in contact with the gate insulating film 303 that is formed in a later step and the region 332 which is in contact with the gate insulating film 303 and is not in contact with the base insulating film 101 are formed.

The oxide semiconductor film 330 can be exposed to the reducing atmosphere with the use of a plasma CVD apparatus, for example. As a gas for producing the reducing atmosphere, a silane ($SiH_4$) gas, a hydrogen ($H_2$) gas, or the like can be used. Alternatively, an atmosphere containing a mixture of a silane ($SiH_4$) gas, a hydrogen ($H_2$) gas, and the like may be used. Further, in order to promote decomposition of the gas, the substrate temperature is preferably increased in the treatment. For example, the substrate temperature is higher than or equal to 350° C. and lower than the strain point of the substrate.

By exposing the oxide semiconductor film 330 to the reducing atmosphere, indium contained in the oxide semiconductor film 330 can be reduced and released. As a result, the concentration of indium in the region of the oxide semiconductor film which is exposed to the reducing atmosphere is decreased.

By forming a region in which the concentration of indium is decreased in the oxide semiconductor film as described above, diffusion of indium from the oxide semiconductor film into the insulating film which is formed in contact with the oxide semiconductor film in a later step (the gate insulating film in this embodiment) can be suppressed.

Then, as illustrated in FIG. 5C, the gate insulating film 303 is formed to cover the oxide semiconductor film 330. Further, the gate electrode 308 is formed over the gate insulating film 303. The gate electrode 308 is formed in such a manner that a conductive film is formed, a mask is formed over the conductive film, and the conductive film is selectively etched with the use of the mask.

Then, the interlayer insulating film 310 is formed over the gate electrode 308 and the gate insulating film 303. Further, contact holes are formed in the interlayer insulating film 310, and the wirings 312 connected to the oxide semiconductor film 330 through the contact holes are formed.

Through the above process, diffusion of indium into the gate insulating film which is formed on and in contact with the oxide semiconductor film can be suppressed.

This embodiment can be combined with any of the other embodiments as appropriate.

Embodiment 5

In this embodiment, a transistor having a structure different from those of the transistors described in Embodiments 1 to 4 will be described with reference to FIG. 6C.

Figure 6A:
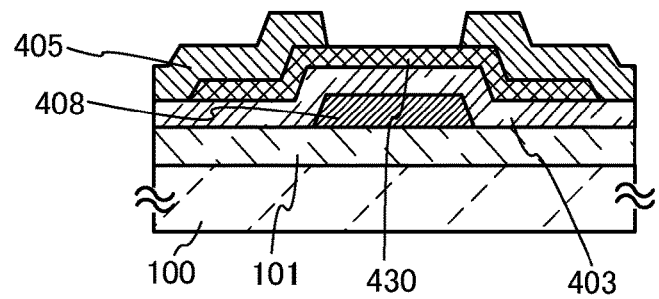
FIGS. 6A to 6C are cross-sectional views illustrating an example of a semiconductor device according to an embodiment of the present invention and an example of a manufacturing process thereof.
Figure 6B:
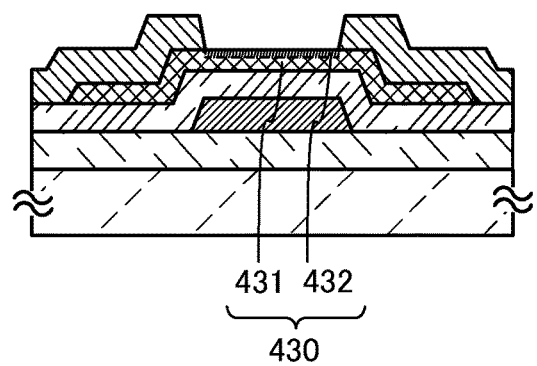
Figure 6C:
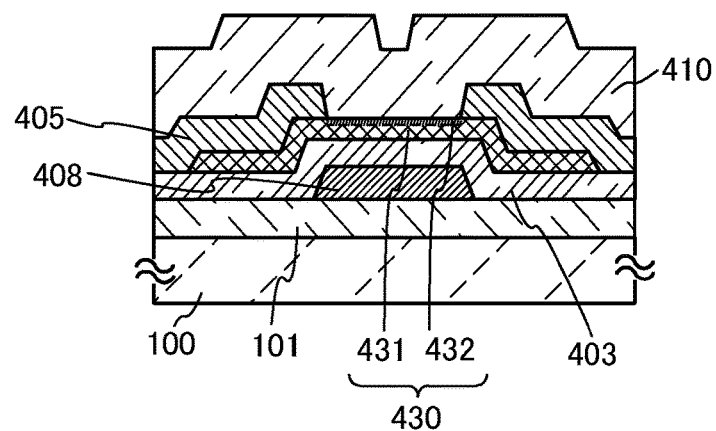

The transistor illustrated in FIG. 6C includes a base insulating film 101 over a substrate 100, a gate electrode 408 over the base insulating film 101, a gate insulating film 403 covering the gate electrode 408, an oxide semiconductor film 430 containing indium over the gate insulating film 403, source and drain electrodes 405 partly in contact with the oxide semiconductor film 430, and an interlayer insulating film 410 covering the oxide semiconductor film 430 and the source and drain electrodes 405. The oxide semiconductor film 430 includes a region 431 which is not in contact with the interlayer insulating film 410 and a region 432 which is in contact with the interlayer insulating film 410 and is not in contact with the gate insulating film 403. In other words, the oxide semiconductor film 430 includes the region 431 in contact with the gate insulating film 403 and the region 432 in contact with the interlayer insulating film 410 and between the interlayer insulating film 410 and region 431. Further, contact holes may be formed in the interlayer insulating film 410, and wirings connected to the source and drain electrodes 405 through the contact holes may be provided.

The oxide semiconductor film, the source and drain electrodes, the gate insulating film, the gate electrode, and the interlayer insulating film described in this embodiment may be formed in a manner similar to that in Embodiment 1.

The concentration of indium contained in the region 432 of the oxide semiconductor film 430, which is in contact with the interlayer insulating film 410 and is not in contact with the gate insulating film 403, is lower than that in the region 431 of the oxide semiconductor film 430, which is not in contact with the interlayer insulating film 410. The concentration of indium in the region 431 of the oxide semiconductor film 430, which is not in contact with the interlayer insulating film 410, is higher than or equal to 10 at. % and lower than or equal to 25 at. %. That is, the oxide semiconductor film 430 includes the region 431 in which the concentration of indium is higher than or equal to 10 at. % and lower than or equal to 25 at. % and the region 432 in which the concentration of indium is lower than that in the region 431. The concentration of indium in the region 432 is higher than or equal to 0 at. % and lower than or equal to 13 at. %, preferably higher than or equal to 0 at. % and lower than 10 at. %. As described above, the concentration of indium contained in the region 432 which is in contact with the interlayer insulating film 410 and is not in contact with the gate insulating film 403 is lower than that in the region 431 which is not in contact with the interlayer insulating film 410, whereby diffusion of indium from the oxide semiconductor film 430 into the interlayer insulating film 410 which is formed on and in contact with the oxide semiconductor film 430 can be suppressed.

With the structure as described above, diffusion of indium into the interlayer insulating film formed on and in contact with the oxide semiconductor film can be suppressed, whereby an increase in leakage current through the interlayer insulating film can be suppressed.

<Example of Method for Manufacturing Transistor>

Next, a method for manufacturing the transistor illustrated in FIG. 6C is described with reference to FIGS. 6A to 6C.

As illustrated in FIG. 6A, the base insulating film 101 is formed over the substrate 100.

Next, the gate electrode 408 is formed over the base insulating film 101. The gate electrode 408 is formed in such a manner that a conductive film is formed, a mask is formed over the conductive film, and the conductive film is selectively etched with the use of the mask.

Then, the gate insulating film 403 is formed to cover the gate electrode 408, and the oxide semiconductor film 430 containing indium is formed over the gate insulating film 403.

The oxide semiconductor film 430 is formed in such a manner that an oxide semiconductor film with a thickness of greater than or equal to 1 nm and less than or equal to 50 nm is formed by a sputtering method, a mask is formed over the oxide semiconductor film, and the oxide semiconductor film is selectively etched with the use of the mask.

The mask used in the etching of the oxide semiconductor film can be formed as appropriate by a photolithography process, an inkjet method, a printing method, or the like. Wet etching or dry etching can be employed as appropriate for the etching of the oxide semiconductor film.

After the oxide semiconductor film is formed, the substrate 100 is preferably subjected to heat treatment to release moisture and hydrogen from the oxide semiconductor film. Through the heat treatment, a CAAC-OS film with higher crystallinity can be formed.

The temperature for the heat treatment is preferably set such that moisture and hydrogen can be released from the oxide semiconductor film; the temperature is typically higher than or equal to 200° C. and lower than the strain point of the substrate 100, preferably higher than or equal to 250° C. and lower than or equal to 450° C.

A rapid thermal annealing (RTA) apparatus can be used for the heat treatment. With the use of the RTA apparatus, heat treatment at a temperature of higher than or equal to the strain point of the substrate can be performed if it is a short time. Thus, the time required for formation of the CAAC-OS film can be shortened.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere, a reduced-pressure atmosphere, or in vacuum. The treatment time is 3 minutes to 24 hours. Heat treatment for longer than 24 hours is not preferable because the productivity is low.

Then, the source and drain electrodes 405 are formed partly in contact with the oxide semiconductor film 430. The source and drain electrodes 405 are formed in such a manner that a conductive film is formed, a mask is formed over the conductive film, and the conductive film is selectively etched with the use of the mask.

Next, as illustrated in FIG. 6B, the oxide semiconductor film 430 is exposed to a reducing atmosphere. Accordingly, the region 431 which is not in contact with the interlayer insulating film 410 that is formed in a later step and the region 432 which is in contact with the interlayer insulating film 410 and is not in contact with the gate insulating film 403 are formed.

The oxide semiconductor film 430 can be exposed to the reducing atmosphere with the use of a plasma CVD apparatus, for example. As a gas for producing the reducing atmosphere, a silane ($SiH_4$) gas, a hydrogen ($H_2$) gas, or the like can be used. Alternatively, an atmosphere containing a mixture of a silane ($SiH_4$) gas, a hydrogen ($H_2$) gas, and the like may be used. Further, in order to promote decomposition of the gas, the substrate temperature is preferably increased in the treatment. For example, the substrate temperature is higher than or equal to 350° C. and lower than the strain point of the substrate.

By exposing the oxide semiconductor film 430 to the reducing atmosphere, indium contained in the oxide semiconductor film 430 can be reduced and released. As a result, the concentration of indium in the region of the oxide semiconductor film which is exposed to the reducing atmosphere is decreased.

By forming a region in which the concentration of indium is decreased in the oxide semiconductor film as described above, diffusion of indium from the oxide semiconductor film into the insulating film which is formed in contact with the oxide semiconductor film in a later step (the interlayer insulating film in this embodiment) can be suppressed.

Then, as illustrated in FIG. 6C, the interlayer insulating film 410 is formed to cover the oxide semiconductor film 430 and the source and drain electrodes 405. Although not illustrated here, contact holes may be formed in the interlayer insulating film 410, and wirings connected to the source and drain electrodes 405 through the contact holes may be formed.

With the structure as described above, diffusion of indium into the interlayer insulating film formed on and in contact with the oxide semiconductor film can be suppressed.

This embodiment can be combined with any of the other embodiments as appropriate.

Embodiment 6

In this embodiment, a transistor having a structure different from those of the transistors described in Embodiments 1 to 5 will be described with reference to FIG. 7.

A cross-sectional view of the transistor illustrated in FIG. 7 will be described in detail below.

Figure 7:
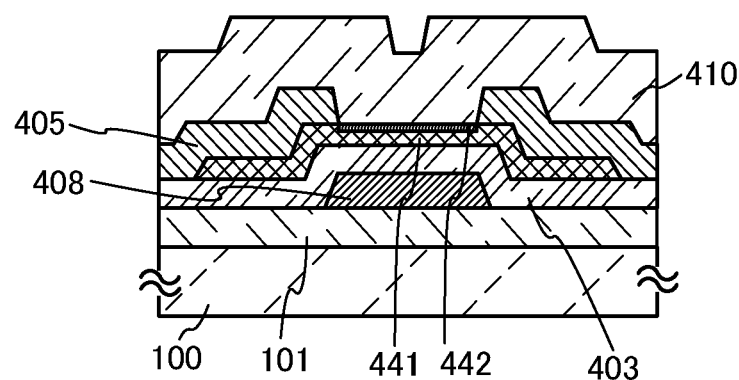
FIG. 7 is a cross-sectional view illustrating an example of a semiconductor device according to an embodiment of the present invention.

The transistor illustrated in FIG. 7 includes a base insulating film 101 over a substrate 100, a gate electrode 408 over the base insulating film 101, a gate insulating film 403 covering the gate electrode 408, an oxide semiconductor film 441 containing indium over the gate insulating film 403, source and drain electrodes 405 in contact with the oxide semiconductor film 441, an oxide insulating film 442 which does not overlap with the source and drain electrodes 405 and is in contact with the oxide semiconductor film 441, and an interlayer insulating film 410 covering the oxide insulating film 442 and the source and drain electrodes 405. Further, contact holes may be formed in the interlayer insulating film 410, and wirings connected to the source and drain electrodes 405 through the contact holes may be provided.

The oxide semiconductor film 441 may be formed in a manner similar to that of the oxide semiconductor film 430 described in Embodiment 5.

The concentration of indium in the oxide semiconductor film 441 is higher than or equal to 10 at. % and lower than or equal to 25 at. %. By releasing indium from the oxide semiconductor film, the oxide semiconductor film 441 and the oxide insulating film 442 as a region which does not substantially contain indium are formed. The oxide insulating film 442 is in contact with a top surface of the oxide semiconductor film 441 and formed at least between the source and drain electrodes 405.

As described above, by forming the oxide insulating film 442, diffusion of indium from the oxide semiconductor film 441 into the interlayer insulating film 410 can be suppressed, and the characteristics of the interface between the oxide semiconductor film and the oxide insulating film can be improved.

In addition, the transistor in this embodiment can be formed by a manufacturing method similar to that in Embodiment 5.

With the use of the structure and the manufacturing method as described above, diffusion of indium into the interlayer insulating film which is formed on and in contact with the oxide semiconductor film can be suppressed. Further, the characteristics of the interface between the oxide semiconductor film and the oxide insulating film can be improved.

This embodiment can be combined with any of the other embodiments as appropriate.

Embodiment 7

In this embodiment, a transistor having a structure different from those of the transistors described in Embodiments 1 to 6 will be described with reference to FIG. 8C.

Figure 8A:
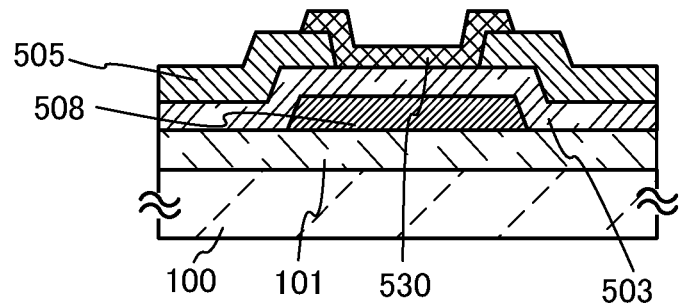
FIGS. 8A to 8C are cross-sectional views illustrating an example of a semiconductor device according to an embodiment of the present invention and an example of a manufacturing process thereof.
Figure 8B:
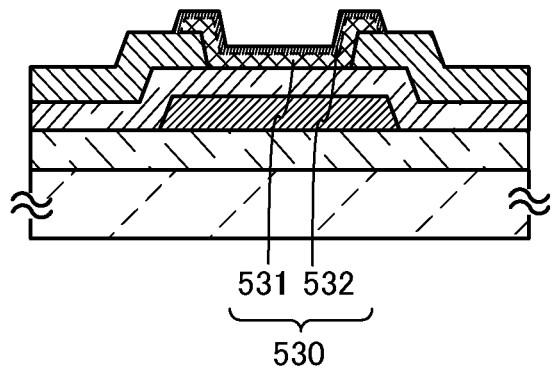
Figure 8C:
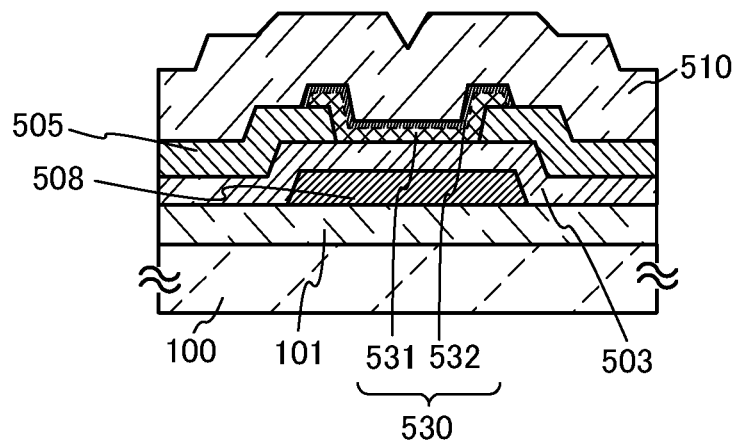

The transistor illustrated in FIG. 8C includes a base insulating film 101 over a substrate 100, a gate electrode 508 over the base insulating film 101, a gate insulating film 503 covering the gate electrode 508, source and drain electrodes 505 over the gate insulating film 503, an oxide semiconductor film 530 containing indium partly in contact with the source and drain electrodes 505, and an interlayer insulating film 510 covering the oxide semiconductor film 530 and the source and drain electrodes 505. The oxide semiconductor film 530 includes a region 531 which is not in contact with the interlayer insulating film 510 and a region 532 which is in contact with the interlayer insulating film 510 and is not in contact with the gate insulating film 503. In other words, the oxide semiconductor film 530 includes the region 531 in contact with the gate insulating film 503 and the region 532 in contact with the interlayer insulating film 510 and between the interlayer insulating film 510 and region 531. Further, contact holes may be formed in the interlayer insulating film 510, and wirings connected to the source and drain electrodes 505 through the contact holes may be provided.

The oxide semiconductor film, the source and drain electrodes, the gate insulating film, the gate electrode, and the interlayer insulating film described in this embodiment may be formed in a manner similar to that in Embodiment 1.

The concentration of indium contained in the region 532 of the oxide semiconductor film 530, which is in contact with the interlayer insulating film 510 and is not in contact with the gate insulating film 503, is lower than that in the region 531 of the oxide semiconductor film 530, which is not in contact with the interlayer insulating film 510. The concentration of indium in the region 531 of the oxide semiconductor film 530, which is not in contact with the interlayer insulating film 510, is higher than or equal to 10 at. % and lower than or equal to 25 at. %. That is, the oxide semiconductor film 530 includes the region 531 in which the concentration of indium is higher than or equal to 10 at. % and lower than or equal to 25 at. % and the region 532 in which the concentration of indium is lower than that in the region 531. The concentration of indium in the region 532 is higher than or equal to 0 at. % and lower than or equal to 13 at. %, preferably higher than or equal to 0 at. % and lower than 10 at. %. As described above, the concentration of indium contained in the region 532 which is in contact with the interlayer insulating film 510 and is not in contact with the gate insulating film 503 is lower than that in the region 531 which is not in contact with the interlayer insulating film 510, whereby diffusion of indium from the oxide semiconductor film 530 into the interlayer insulating film 510 which is formed on and in contact with the oxide semiconductor film 530 can be suppressed.

With the structure as described above, diffusion of indium into the interlayer insulating film formed on and in contact with the oxide semiconductor film can be suppressed, whereby an increase in leakage current through the interlayer insulating film can be suppressed.

<Example of Method for Manufacturing Transistor>

Next, a method for manufacturing the transistor illustrated in FIG. 8C is described with reference to FIGS. 8A to 8C.

As illustrated in FIG. 8A, the base insulating film 101 is formed over the substrate 100.

Next, the gate electrode 508 is formed over the base insulating film 101. The gate electrode 508 is formed in such a manner that a conductive film is formed, a mask is formed over the conductive film, and the conductive film is selectively etched with the use of the mask.

Then, the gate insulating film 503 is formed to cover the gate electrode 508, and the source and drain electrodes 505 are formed over the gate insulating film 503. The source and drain electrodes 505 are formed in such a manner that a conductive film is formed, a mask is formed over the conductive film, and the conductive film is selectively etched with the use of the mask.

Then, the oxide semiconductor film 530 containing indium is formed partly in contact with the source and drain electrodes 505.

The oxide semiconductor film 530 is formed in such a manner that an oxide semiconductor film with a thickness of greater than or equal to 1 nm and less than or equal to 50 nm is formed by a sputtering method, a mask is formed over the oxide semiconductor film, and the oxide semiconductor film is selectively etched with the use of the mask.

The mask used in the etching of the oxide semiconductor film can be formed as appropriate by a photolithography process, an inkjet method, a printing method, or the like. Wet etching or dry etching can be employed as appropriate for the etching of the oxide semiconductor film.

After the oxide semiconductor film is formed, the substrate 100 is preferably subjected to heat treatment to release moisture and hydrogen from the oxide semiconductor film. Through the heat treatment, a CAAC-OS film with higher crystallinity can be formed.

The temperature for the heat treatment is preferably set such that moisture and hydrogen can be released from the oxide semiconductor film; the temperature is typically higher than or equal to 200° C. and lower than the strain point of the substrate 100, preferably higher than or equal to 250° C. and lower than or equal to 450° C.

A rapid thermal annealing (RTA) apparatus can be used in the heat treatment. With the use of the RTA apparatus, heat treatment at a temperature of higher than or equal to the strain point of the substrate can be performed if it is a short time. Thus, the time required for formation of the CAAC-OS film can be shortened.

The heat treatment can be performed in an inert gas atmosphere; typically, the heat treatment is preferably performed in a rare gas (such as helium, neon, argon, xenon, or krypton) atmosphere or a nitrogen atmosphere. Alternatively, the heat treatment may be performed in an oxygen atmosphere, a reduced-pressure atmosphere, or in vacuum. The treatment time is 3 minutes to 24 hours. Heat treatment for longer than 24 hours is not preferable because the productivity is low.

Next, as illustrated in FIG. 8B, the oxide semiconductor film 530 is exposed to a reducing atmosphere. Accordingly, the region 531 which is not in contact with the interlayer insulating film 510 that is formed in a later step and the region 532 which is in contact with the interlayer insulating film 510 and is not in contact with the gate insulating film 503 are formed.

The oxide semiconductor film 530 can be exposed to the reducing atmosphere with the use of a plasma CVD apparatus, for example. As a gas for producing the reducing atmosphere, a silane ($SiH_4$) gas, a hydrogen ($H_2$) gas, or the like can be used. Alternatively, an atmosphere containing a mixture of a silane ($SiH_4$) gas, a hydrogen ($H_2$) gas, and the like may be used. Further, in order to promote decomposition of the gas, the substrate temperature is preferably increased in the treatment. For example, the substrate temperature is higher than or equal to 350° C. and lower than the strain point of the substrate.

By exposing the oxide semiconductor film 530 to the reducing atmosphere, indium contained in the oxide semiconductor film 530 can be reduced and released. As a result, the concentration of indium in the region of the oxide semiconductor film which is exposed to the reducing atmosphere is decreased.

By forming a region in which the concentration of indium is decreased in the oxide semiconductor film as described above, diffusion of indium from the oxide semiconductor film into the insulating film which is formed in contact with the oxide semiconductor film in a later step (the interlayer insulating film in this embodiment) can be suppressed.

Then, as illustrated in FIG. 8C, the interlayer insulating film 510 is formed to cover the oxide semiconductor film 530 and the source and drain electrodes 505. Although not illustrated here, contact holes may be provided in the interlayer insulating film 510 and wirings connected to the source and drain electrodes 505 through the contact holes may be formed.

With the structure as described above, diffusion of indium into the interlayer insulating film formed in contact with the oxide semiconductor film can be suppressed.

This embodiment can be combined with any of the other embodiments as appropriate.

Embodiment 8

In this embodiment, a liquid crystal display device manufactured using the transistor described in any of Embodiments 1 to 7 will be described. Note that an example in which an embodiment of the present invention is applied to a liquid crystal display device will be described in this embodiment; however, the present invention is not limited to this embodiment. For example, application of an embodiment of the present invention to an electroluminescence (EL) display device which is one kind of light-emitting device is readily conceived by those skilled in the art.

Figure 9:
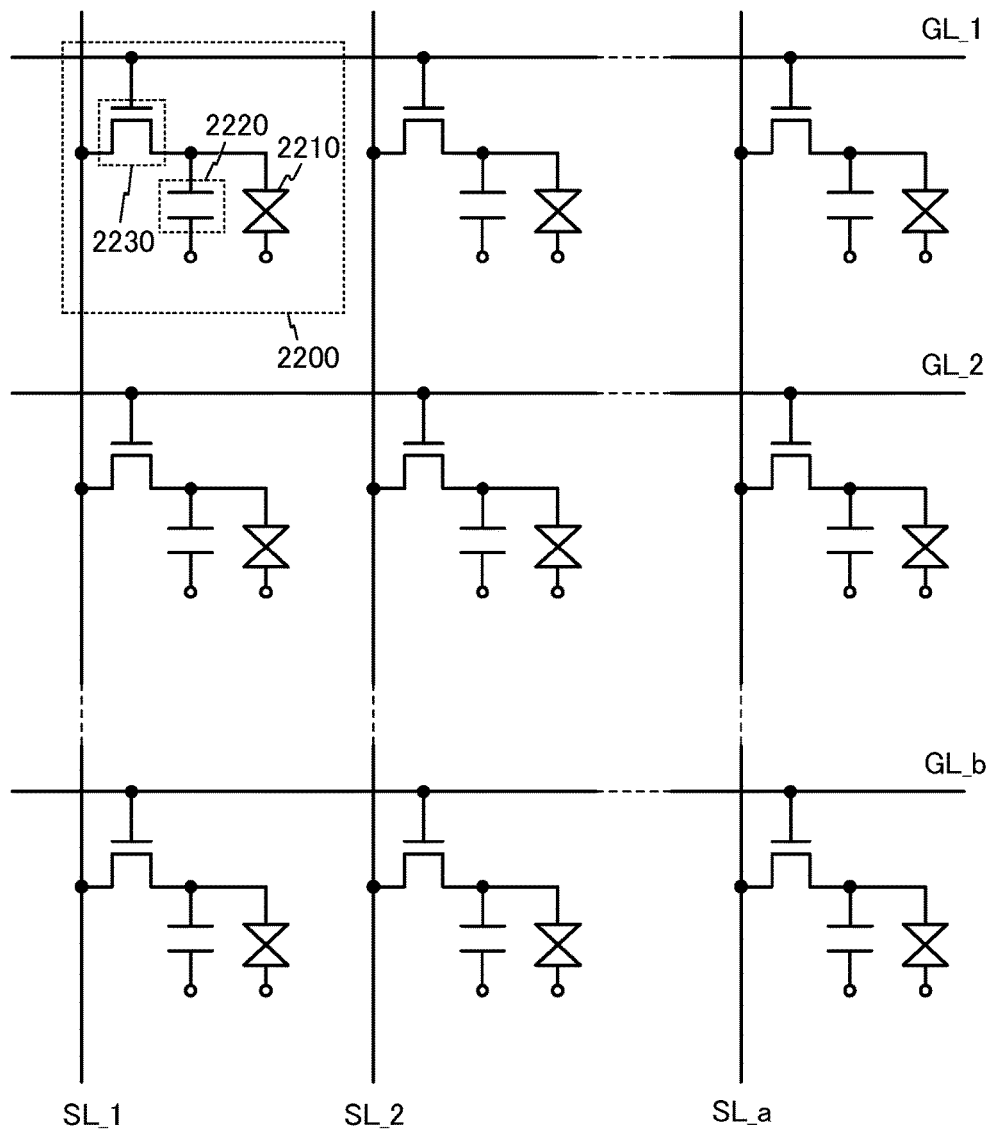
FIG. 9 is a circuit diagram illustrating an example of a liquid crystal display device including a transistor according to an embodiment of the present invention.

FIG. 9 is a circuit diagram of an active matrix liquid crystal display device. The liquid crystal display device includes source lines SL_1 to SL_a, gate lines GL_1 to GL_b, and a plurality of pixels 2200. The pixels 2200 each include a transistor 2230, a capacitor 2220, and a liquid crystal element 2210. The plurality of pixels 2200 with such a structure form a pixel portion of the liquid crystal display device. In the case where the source line or the gate line is simply mentioned, it is denoted as the source line SL or the gate line GL in some cases.

The transistor described in any of Embodiments 1 to 7 is used as the transistor 2230. Since the transistor according to an embodiment of the present invention is a transistor including an oxide semiconductor, a display device with high field-effect mobility and high display quality can be obtained.

The gate line GL is connected to a gate of the transistor 2230, the source line SL is connected to a source of the transistor 2230, and a drain of the transistor 2230 is connected to one capacitor electrode of the capacitor 2220 and one pixel electrode of the liquid crystal element 2210. The other capacitor electrode of the capacitor 2220 and the other pixel electrode of the liquid crystal element 2210 are each connected to a common electrode. Note that the common electrode may be formed in the same layer as the gate line GL using the same material as the gate line GL.

Further, the gate line GL is connected to a gate driver circuit. The gate driver circuit may include the transistor described in any of Embodiments 1 to 7.

The source line SL is connected to a source driver circuit. The source driver circuit may include the transistor described in any of Embodiments 1 to 7.

Note that one of or both the gate driver circuit and the source driver circuit may be formed over a separately prepared substrate and connected using a method such as chip on glass (COG), wire bonding, or tape automated bonding (TAB).

Since the transistor is easily broken by static electricity or the like, a protection circuit is preferably provided. The protection circuit is preferably formed using a nonlinear element.

When a voltage is applied to the gate line GL to be higher than or equal to the threshold voltage of the transistor 2230, electric charge supplied from the source line SL flows as a drain current of the transistor 2230 and is accumulated in the capacitor 2220. After charging for one row, the transistors 2230 in the row are turned off and voltage application from the source lines SL stops; however, a necessary voltage can be kept by the electric charge accumulated in the capacitors 2220. Then, charging of the capacitors 2220 in the next row starts. In this manner, charging for a first row to a b-th row is carried out.

Note that in the case where a transistor whose off-state current is small is used as the transistor 2230, a time period during which the voltage is held can be longer. By this effect, the display rewriting frequency can be low in the case of displaying an image with little motion (including a still image); accordingly, a further decrease in power consumption is possible. Further, the capacity of the capacitor 2220 can be further decreased; accordingly, power consumed for charging can be decreased.

As described above, according to an embodiment of the present invention, a liquid crystal display device with high display quality and low power consumption can be provided.

This embodiment can be combined with any of the other embodiments as appropriate.

Embodiment 9

In this embodiment, an example of manufacturing a semiconductor memory device using the transistor described in any of Embodiments 1 to 7 will be described.

As typical examples of a volatile semiconductor memory device, there are a dynamic random access memory (DRAM) which stores data in such a manner that a transistor included in a memory element is selected and electric charge is accumulated in a capacitor, and a static random access memory (SRAM) which holds stored data using a circuit such as a flip-flop.

Typical examples of a nonvolatile semiconductor memory device include a flash memory which has a node between a gate and a channel region of a transistor and stores data by holding electric charge in the node.

The transistor described in any of Embodiments 1 to 7 can be applied to some of transistors included in the above-described semiconductor memory device.

First, a DRAM to which the transistor described in any of Embodiments 1 to 7 is applied will be described with reference to FIGS. 10A and 10B.

Figure 10A:
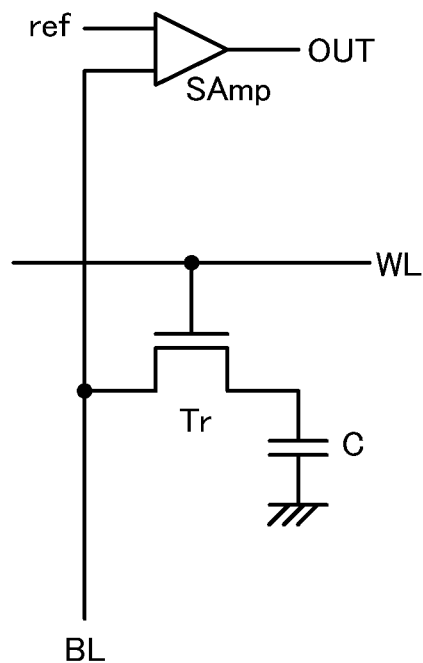
FIGS. 10A and 10B are a circuit diagram illustrating an example of a semiconductor memory device including a transistor according to an embodiment of the present invention and a graph showing a relation between voltage (V) and time (T).

The DRAM includes a bit line BL, a word line WL, a sense amplifier SAmp, a transistor Tr, and a capacitor C (see FIG. 10A).

Figure 10B:
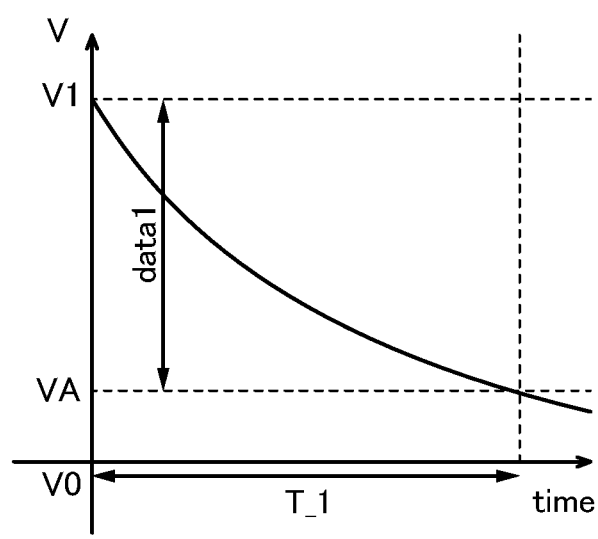

It is known that the voltage held by the capacitor C is gradually decreased over time owing to the off-state current of the transistor Tr as shown in FIG. 10B. After a certain period of time, the voltage originally charged from V0 to V1 is decreased to VA which is a limit for reading data 1. This period is called a holding period T_1. In the case of a two-level DRAM, refresh needs to be performed within the holding period T_1.

When the transistor described in any of Embodiments 1 to 7 is employed as the transistor Tr, the holding period T_1 can be made longer because the off-state current of the transistor is small. That is, the frequency of refresh operation can be low. Accordingly, power consumption can be decreased. For example, when a DRAM is formed using a transistor in which a highly purified oxide semiconductor film is included and the off-state current is less than or equal to $1 \times 10^{-21}$ A, preferably less than or equal to $1 \times 10^{-24}$ A, data can be held for several days to several decades without supply of electric power.

As described above, using an embodiment of the present invention, a DRAM having high reliability and low power consumption can be provided.

Next, a nonvolatile memory to which the transistor described in any of Embodiments 1 to 7 is applied will be described with reference to FIGS. 11A and 11B.

Figure 11A:
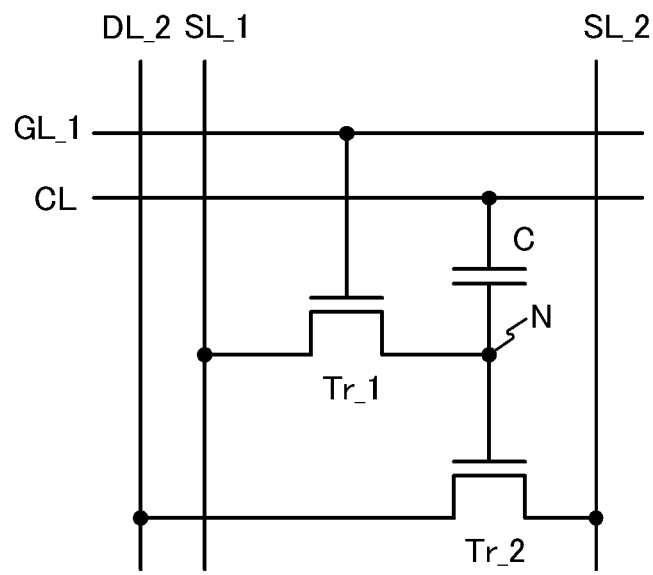
FIGS. 11A and 11B are a circuit diagram illustrating an example of a semiconductor memory device including a transistor according to an embodiment of the present invention and a graph showing a relation between voltage (V) and current (I).
Figure 11B:
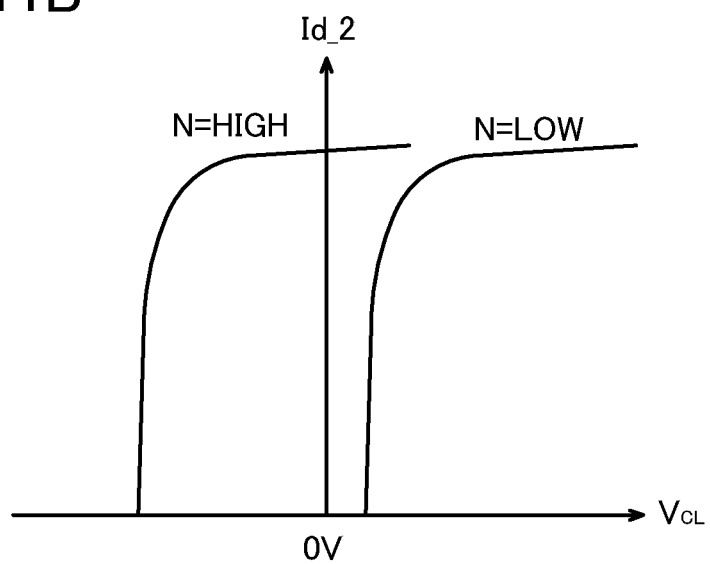

FIG. 11A is a circuit diagram of a nonvolatile memory. The nonvolatile memory includes a transistor Tr_1, a gate line GL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor line CL connected to one terminal of the capacitor C, and a node N connected to the other terminal of the capacitor C, a drain of the transistor Tr_1, and a gate of the transistor Tr_2.

The nonvolatile memory described in this embodiment utilizes a change in the threshold voltage of the transistor Tr_2, which depends on the voltage of the node N. For example, FIG. 11B is a graph showing a relation between the drain current Id_2 flowing through the transistor Tr_2 and the voltage $V_{CL}$ of the capacitor line CL.

The node N can control voltage through the transistor Tr_1. For example, the voltage of the source line SL_1 is set to VDD. In this case, when the voltage of the gate line GL_1 is set to be higher than or equal to a voltage obtained by adding VDD to the threshold voltage Vth of the transistor Tr_1, the voltage of the node N can be HIGH. Further, when the voltage of the gate line GL_1 is set to be lower than or equal to the threshold voltage Vth of the transistor Tr_1, the voltage of the node N can be LOW.

Thus, either a $V_{CL}$-Id_2 curve (N=LOW) or a $V_{CL}$-Id_2 curve (N=HIGH) can be obtained. That is, when N=LOW, Id_2 is small at a $V_{CL}$ of 0V; accordingly, data 0 is stored. Further, when N=HIGH, Id_2 is large at a $V_{CL}$ of 0V; accordingly, data 1 is stored. In this manner, data can be stored.

Since the off-state current of the transistor described in any of Embodiments 1 to 7 can be made to be extremely small, when the transistor described in any of Embodiments 1 to 7 is used as the transistor Tr_1, unintentional leakage of electric charge accumulated in the node N through the transistor Tr_1 can be suppressed. Therefore, data can be held for a long period. By using an embodiment of the present invention, the threshold voltage of the transistor Tr_1 is controlled, which enables a decrease in the voltage necessary for writing. Thus, power consumption can be made small as compared to a flash memory or the like.

Note that the transistor described in any of Embodiments 1 to 7 may be applied to the transistor Tr_2.

Next, a structure of the nonvolatile memory shown in FIG. 11A without a capacitor is described with reference to FIG. 12.

Figure 12:
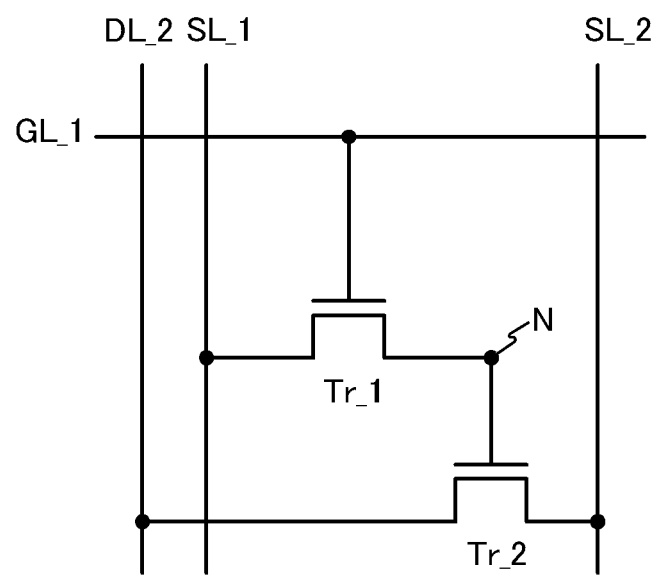
FIG. 12 is a circuit diagram illustrating an example of a semiconductor memory device including a transistor according to an embodiment of the present invention.

FIG. 12 is a circuit diagram of a nonvolatile memory. The nonvolatile memory includes a transistor Tr_1, a gate line GL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, and a node formed to be connected to a drain of the transistor Tr_1 and a gate of the transistor Tr_2.

In the case where the transistor Tr_1 is a normally-off transistor and a transistor whose off-state current is very small is used as the transistor Tr_1, electric charge can be held at the node N between the drain of the transistor Tr_1 and the gate of the transistor Tr_2 even without a capacitor. The structure without a capacitor makes it possible to decrease an area of the nonvolatile memory, so that the integration degree of a memory module using the nonvolatile memory can be more increased than that of the structure with a capacitor. However, in the case where the transistor Tr_1 is a normally-on transistor or the off-state current is a little large, the threshold voltage of the transistor Tr_1 can be controlled by providing a backgate, a transistor, or a diode.

Although the nonvolatile memory including four or five wirings is described in this embodiment, the structure of the nonvolatile memory is not limited thereto. For example, a structure in which one wiring functions as the source line SL_1 and the drain line DL_2 may be employed.

As described above, in accordance with an embodiment of the present invention, a semiconductor memory device with high reliability for a long time, low power consumption, and a high integration degree can be obtained.

This embodiment can be combined with any of the other embodiments as appropriate.

Embodiment 10

A central processing unit (CPU) can be formed using a transistor including an oxide semiconductor for at least part thereof.

Figure 13A:
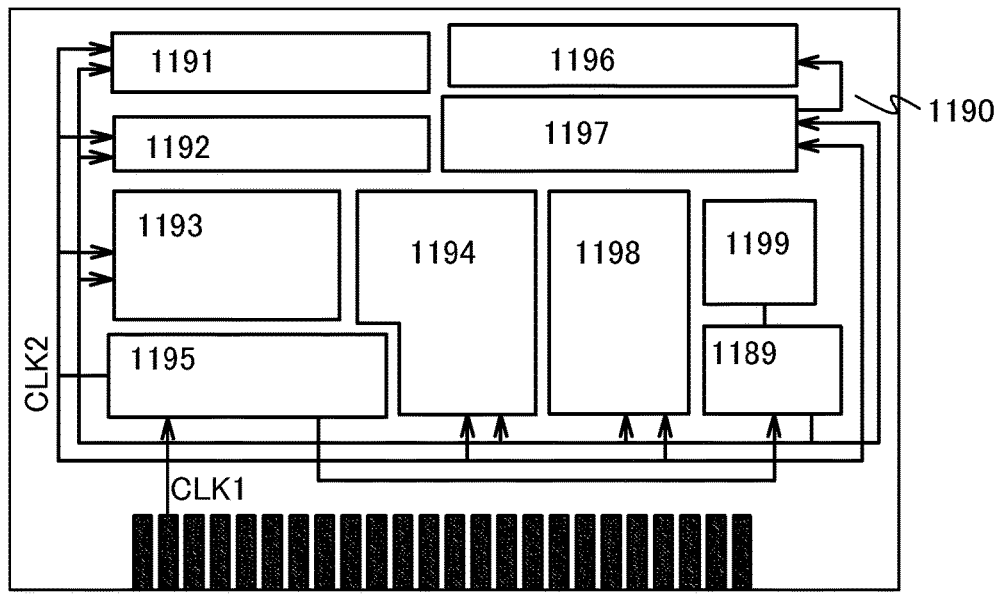
FIG. 13A is a block diagram illustrating a specific example of a CPU including a transistor according to an embodiment of the present invention and FIGS. 13B and 13C are circuit diagrams each illustrating part of the CPU.

FIG. 13A is a block diagram illustrating a specific structure of a CPU. The CPU illustrated in FIG. 13A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a ROM 1199 which is rewritable, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 13A is only an example in which the structure is simplified, and an actual CPU may have various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 13A, a memory element is provided in the register 1196. The memory element described in Embodiment 9 can be used as the memory element provided in the register 1196.

In the CPU illustrated in FIG. 13A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 13B:
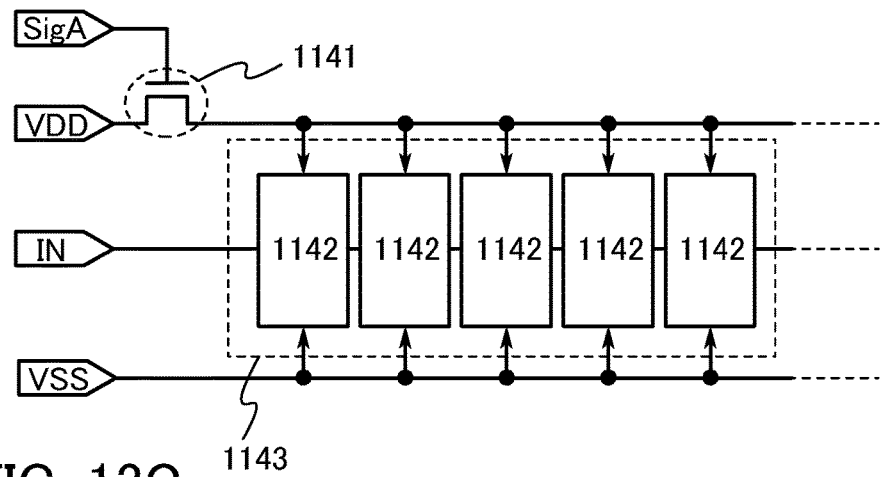
Figure 13C:
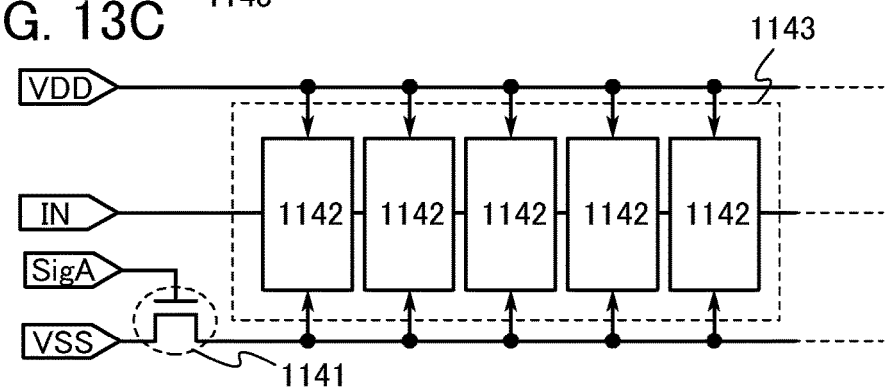

The supply of the power supply voltage can be stopped by providing a switching element between a memory element group and a node to which a power supply potential VDD or a power supply potential VSS is supplied, as illustrated in FIG. 13B or FIG. 13C. Circuits illustrated in FIGS. 13B and 13C are described below.

FIGS. 13B and 13C each illustrate an example of a structure of a memory circuit including a transistor including an oxide semiconductor as a switching element for controlling supply of a power supply potential to a memory element.

The memory device illustrated in FIG. 13B includes a switching element 1141 and a memory element group 1143 including a plurality of memory elements 1142. Specifically, as each of the memory elements 1142, the memory element described in Embodiment 5 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 13B, a transistor including a semiconductor with a wide band gap such as an oxide semiconductor is used as the switching element 1141, and the switching of the transistor is controlled by a signal Sig A supplied to a gate thereof.

Note that FIG. 13B illustrates the structure in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 13B, the switching element 1141 may control the supply of the low-level power supply potential VSS.

In FIG. 13C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where an operation of a CPU is temporarily stopped and the supply of the power supply voltage is temporarily stopped; accordingly, power consumption can be low. For example, while a user of a personal computer does not input data to an input device such as a keyboard, the operation of the CPU can be stopped, so that the power consumption can be low.

Although the CPU is given as an example, the transistor can also be applied to an LSI such as a digital signal processor (DSP), a custom LSI, or a field programmable gate array (FPGA).

This embodiment can be combined with any of the above-described embodiments as appropriate.

Embodiment 11

In this embodiment, examples of electronic devices to which any of Embodiments 1 to 10 is applied will be described.

Figure 14A:
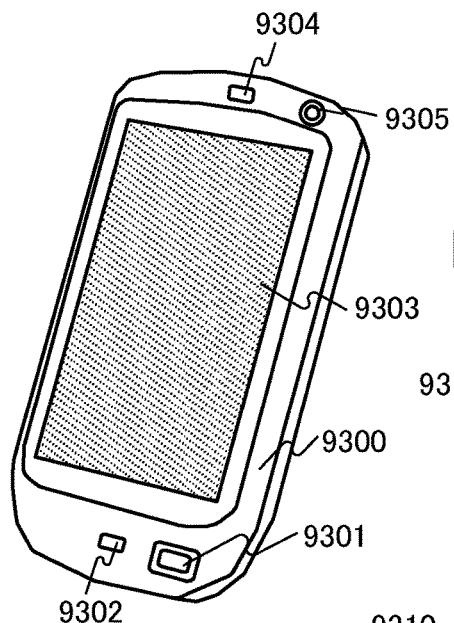
FIGS. 14A to 14C are perspective views each illustrating an example of an electronic device according to an embodiment of the present invention.

FIG. 14A illustrates a portable information terminal. The portable information terminal includes a housing 9300, a button 9301, a microphone 9302, a display portion 9303, a speaker 9304, and a camera 9305, and has a function as a mobile phone. An embodiment of the present invention can be applied to the display portion 9303 and the camera 9305. Although not illustrated, an embodiment of the present invention can also be applied to an arithmetic unit, a wireless circuit, or a memory circuit inside a main body.

Figure 14B:
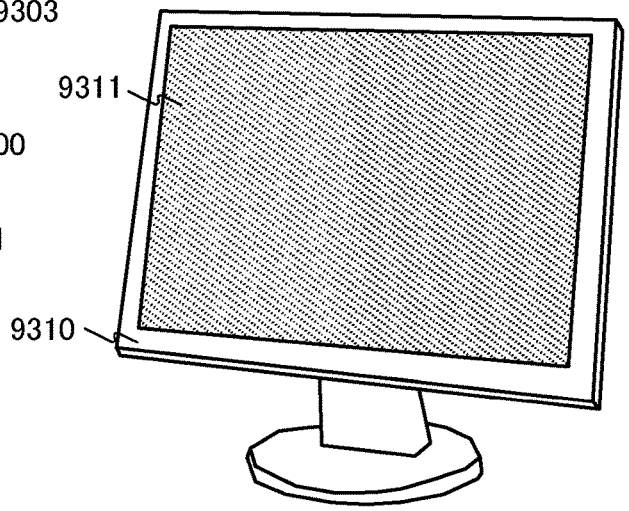

FIG. 14B illustrates a display which includes a housing 9310 and a display portion 9311. An embodiment of the present invention can be applied to the display portion 9311. When an embodiment of the present invention is employed, a display having high display quality can be provided even in the case where the size of the display portion 9311 is increased.

Figure 14C:
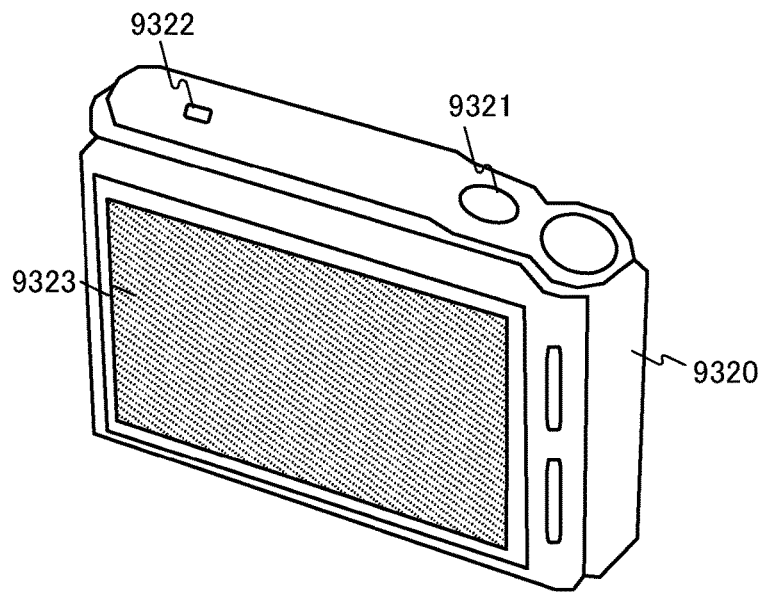

FIG. 14C illustrates a digital still camera. The digital still camera includes a housing 9320, a button 9321, a microphone 9322, and a display portion 9323. An embodiment of the present invention can be applied to the display portion 9323. Although not illustrated, an embodiment of the present invention can also be applied to a memory circuit or an image sensor.

By applying an embodiment of the present invention, the performance of an electronic device can be improved and the reliability of the electronic device can be improved.

This embodiment can be combined with any of the other embodiments as appropriate.

Example 1

An oxide semiconductor film containing indium was exposed to a reducing atmosphere and the composition of a surface of the oxide semiconductor film was examined. The result thereof will be described in this example.

A sample was manufactured in such a manner that an oxide semiconductor film was formed with a thickness of 30 nm over a glass substrate by a sputtering method with the use of an In—Ga—Zn—O (In:Ga:Zn=1:1:1 in atomic ratio) target. After that, the oxide semiconductor film was subjected to treatment using a plasma CVD apparatus in various atmospheres.

The treatment using a plasma CVD apparatus was performed under the following three conditions: keeping the substrate temperature at 400° C. in a nitrogen atmosphere, keeping the substrate temperature at 200° C. in a silane atmosphere, and keeping the substrate temperature at 400° C. in a silane atmosphere. A pressure of 133 Pa and a treatment time of 5 minutes were common to all the treatment. An oxide semiconductor film which was not subjected to the above treatment was used as a reference for comparison. Compositions of surfaces of oxide semiconductor films of samples manufactured under the above conditions were evaluated by being quantified by X-ray photoelectron spectroscopy (XPS) analysis.

Table 1 shows the results of XPS analysis.

TABLE 1

| Condition | Concentration (at · %) | | | | |
|---|---|---|---|---|---|
| | Indium (In) | Gallium (Ga) | Zinc (Zn) | Oxygen (O) | Impurity |
| Treatment Not Performed | 14.0 | 13.9 | 8.9 | 52.5 | 10.7 |
| Keeping Substrate Temperature at 400° C. in Nitrogen Atmosphere | 14.4 | 13.2 | 9.0 | 55.0 | 8.4 |
| Keeping Substrate Temperature at 200° C. in Silane Atmosphere | 13.1 | 12.4 | 8.2 | 54.1 | 12.3 |
| Keeping Substrate Temperature at 400° C. in Silane Atmosphere | 10.3 | 13.2 | 8.6 | 58.6 | 9.2 |

The results show the following. Only the sample obtained by keeping the substrate temperature at 400° C. in a silane atmosphere has a composition different from that of the sample which was not subjected to any treatment. The nitrogen atmosphere which is an inert atmosphere cannot release indium from the oxide semiconductor film whereas the silane atmosphere which is a reducing atmosphere can release indium from the oxide semiconductor film. In other words, the nitrogen atmosphere which is an inert atmosphere cannot decrease the concentration of indium in the oxide semiconductor film whereas the silane atmosphere which is a reducing atmosphere can decrease the concentration of indium in the oxide semiconductor film. It is preferable to increase the temperature of the atmosphere to allow a gas constituting the reducing atmosphere to easily decompose because the effect of release of indium was great when the treatment temperature at 400° C. in the silane atmosphere was employed.

This application is based on Japanese Patent Application serial no. 2011-069542 filed with Japan Patent Office on Mar. 28, 2011, the entire contents of which are hereby incorporated by reference.

What is claimed is:

1. A semiconductor device comprising:
   a first insulating film over a substrate;
   an oxide semiconductor film containing indium over the first insulating film;
   a source electrode and a drain electrode over the oxide semiconductor film; and
   a second insulating film over the source electrode and the drain electrode,
   wherein the first insulating film is in contact with a first region of the oxide semiconductor film,
   wherein the second insulating film is in contact with a second region of the oxide semiconductor film,
   wherein one of the source electrode and the drain electrode is in contact with a third region of the oxide semiconductor film, the third region including a top surface of the oxide semiconductor film,
   wherein a concentration of indium in the second region is lower than a concentration of indium in the first region, and
   wherein the concentration of indium in the second region is lower than a concentration of indium in the third region.

2. The semiconductor device according to claim 1, wherein the oxide semiconductor film further contains at least one element selected from the group consisting of Ga, Sn, and Zn.

3. The semiconductor device according to claim 1, wherein the concentration of indium in the first region is higher than or equal to 10 at. % and lower than or equal to 25 at. %.

4. The semiconductor device according to claim 1, wherein the concentration of indium in the second region is higher than or equal to 0 at. % and lower than 13 at. %.

5. The semiconductor device according to claim 1, wherein the second region does not substantially contain indium.

6. The semiconductor device according to claim 1, wherein the second region overlaps with neither the source electrode nor the drain electrode.

7. The semiconductor device according to claim 1, wherein the oxide semiconductor film comprises a crystal, a c-axis of the crystal being parallel to a normal vector of a surface of the oxide semiconductor film.

8. A semiconductor device comprising:
   a first insulating film over a substrate;
   a source electrode and a drain electrode over the first insulating film;
   an oxide semiconductor film containing indium over the source electrode and the drain electrode; and
   a second insulating film over the oxide semiconductor film,
   wherein the first insulating film is in contact with a first region of the oxide semiconductor film,
   wherein the second insulating film is in contact with a second region of the oxide semiconductor film,
   wherein a concentration of indium in the second region is lower than a concentration of indium in the first region, and
   wherein the oxide semiconductor film comprises a crystal, a c-axis of the crystal being parallel to a normal vector of a surface of the oxide semiconductor film.

9. The semiconductor device according to claim 8, wherein the oxide semiconductor film further contains at least one element selected from the group consisting of Ga, Sn, and Zn.

10. The semiconductor device according to claim 8, wherein the concentration of indium in the first region is higher than or equal to 10 at. % and lower than or equal to 25 at. %.

11. The semiconductor device according to claim 8, wherein the second region does not substantially contain indium.

12. The semiconductor device according to claim 8, wherein the concentration of indium in the second region is higher than or equal to 0 at. % and lower than 13 at. %.

13. A semiconductor device comprising:
   a gate electrode over a substrate;
   a gate insulating film over covering the gate electrode;
   an oxide semiconductor film containing indium over the gate insulating film; and
   an insulating film over the oxide semiconductor film,
   wherein the gate insulating film is in contact with a first region of the oxide semiconductor film,
   wherein the insulating film is in contact with a second region of the oxide semiconductor film,
   wherein a concentration of indium in the second region is lower than a concentration of indium in the first region, and wherein the oxide semiconductor film comprises a crystal, a c-axis of the crystal being parallel to a normal vector of a surface of the oxide semiconductor film.

14. The semiconductor device according to claim 13, wherein the oxide semiconductor film further contains at least one element selected from the group consisting of Ga, Sn, and Zn.

15. The semiconductor device according to claim 13, wherein the concentration of indium in the first region is higher than or equal to 10 at. % and lower than or equal to 25 at. %.

16. The semiconductor device according to claim 13, wherein the second region does not substantially contain indium.

17. The semiconductor device according to claim 13, wherein the concentration of indium in the second region is higher than or equal to 0 at. % and lower than 13 at. %.

18. A semiconductor device comprising:
an insulating film over a substrate;
an oxide semiconductor film containing indium over the insulating film;
a gate insulating film over the oxide semiconductor film;
a gate electrode over the gate insulating film; and
a wiring over and in contact with the oxide semiconductor film through an opening of the gate insulating film,
wherein the insulating film is in contact with a first region of the oxide semiconductor film,
wherein the gate insulating film is in contact with a second region of the oxide semiconductor film,
wherein a concentration of indium in the second region is lower than a concentration of indium in the first region, and
wherein the oxide semiconductor film comprises a crystal, a c-axis of the crystal being parallel to a normal vector of a surface of the oxide semiconductor film.

19. The semiconductor device according to claim 18, wherein the second region does not substantially contain indium.

20. The semiconductor device according to claim 18, wherein the oxide semiconductor film further contains at least one element selected from the group consisting of Ga, Sn, and Zn.

21. The semiconductor device according to claim 18, wherein the concentration of indium in the first region is higher than or equal to 10 at. % and lower than or equal to 25 at. %.

22. The semiconductor device according to claim 18, wherein the concentration of indium in the second region is higher than or equal to 0 at. % and lower than 13 at. %.

23. A semiconductor device comprising:
a gate electrode over a substrate;
a gate insulating film over the gate electrode;
an oxide semiconductor film containing indium over the gate insulating film; and
an insulating film over the oxide semiconductor film,
wherein the gate insulating film is in contact with a first region of the oxide semiconductor film,
wherein the insulating film is in contact with a second region of the oxide semiconductor film,
wherein a concentration of indium in the second region is lower than a concentration of indium in the first region, and
wherein at least a region of the oxide semiconductor film comprises crystals, wherein c-axis of each crystal is substantially parallel to a normal vector of a surface of the oxide semiconductor film at a location of the crystal.

24. The semiconductor device according to claim 23, wherein the oxide semiconductor film further contains at least one element selected from the group consisting of Ga, Sn, and Zn.

25. The semiconductor device according to claim 23, wherein the concentration of indium in the first region is higher than or equal to 10 at. % and lower than or equal to 25 at. %.

26. The semiconductor device according to claim 23, wherein the second region does not substantially contain indium.

27. The semiconductor device according to claim 23, wherein the concentration of indium in the second region is higher than or equal to 0 at. % and lower than 13 at. %.

* * * * *

UNITED STATES PATENT AND TRADEMARK OFFICE
CERTIFICATE OF CORRECTION

PATENT NO. : 9,929,280 B2
APPLICATION NO. : 15/240332
DATED : March 27, 2018
INVENTOR(S) : Kosei Noda et al.

Page 1 of 1

It is certified that error appears in the above-identified patent and that said Letters Patent is hereby corrected as shown below:

In the Specification

At Column 6, Line 12, "(SOT)" should be --(SOI)--;

At Column 33, in Table 1, "Concentration (at · %)" should be --Concentration (at. %)--;

In the Claims

In Claim 13, at Column 34, Line 56, "over covering the" should be --over the--.

Signed and Sealed this
Third Day of July, 2018

Andrei Iancu
*Director of the United States Patent and Trademark Office*